(12) United States Patent
Yamazaki et al.

(10) Patent No.: US 8,463,986 B2
(45) Date of Patent: Jun. 11, 2013

(54) MEMORY SYSTEM AND METHOD OF CONTROLLING MEMORY SYSTEM

(75) Inventors: Hajime Yamazaki, Tokyo (JP);
Yasuhiro Kimura, Kanagawa (JP);
Hiroshi Yao, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 13/209,029

(22) Filed: Aug. 12, 2011

(65) Prior Publication Data
US 2011/0302361 A1 Dec. 8, 2011

Related U.S. Application Data

(63) Continuation of application No. PCT/JP2010/052480, filed on Feb. 12, 2010.

(30) Foreign Application Priority Data

Feb. 12, 2009 (JP) .................................. 2009-030299

(51) Int. Cl.
*G06F 12/00* (2006.01)

(52) U.S. Cl.
USPC ................................ 711/103; 711/5; 711/170

(58) Field of Classification Search
None
See application file for complete search history.

(56) References Cited

U.S. PATENT DOCUMENTS

| | | | |
|---|---|---|---|
| 6,834,322 B2 | 12/2004 | Sukegawa | |
| 7,383,375 B2 | 6/2008 | Sinclair | |
| 7,433,993 B2 | 10/2008 | Sinclair | |
| 7,904,640 B2 | 3/2011 | Yano et al. | |
| 7,949,910 B2 | 5/2011 | Kanno et al. | |
| 7,953,920 B2 | 5/2011 | Yano et al. | |
| 7,958,411 B2 | 6/2011 | Kanno et al. | |
| 7,962,688 B2 | 6/2011 | Yano et al. | |
| 2005/0144363 A1 | 6/2005 | Sinclair | |
| 2009/0222616 A1 | 9/2009 | Yano et al. | |
| 2009/0222617 A1 | 9/2009 | Yano et al. | |
| 2009/0222628 A1 | 9/2009 | Yano et al. | |
| 2009/0222629 A1 | 9/2009 | Yano et al. | |
| 2009/0228642 A1 | 9/2009 | Yano et al. | |
| 2009/0235015 A1 | 9/2009 | Hatsuda et al. | |
| 2009/0235016 A1 | 9/2009 | Yano et al. | |
| 2009/0240871 A1 | 9/2009 | Yano et al. | |
| 2009/0241010 A1 | 9/2009 | Yano et al. | |
| 2009/0248964 A1 | 10/2009 | Yano et al. | |

(Continued)

FOREIGN PATENT DOCUMENTS

| | | |
|---|---|---|
| JP | 2007-517325 | 6/2007 |
| WO | WO 2005/066770 A2 | 7/2005 |
| WO | WO 2009/130809 A1 | 10/2009 |

OTHER PUBLICATIONS

J. Hennessy, et al., "Computer Organization and Design: the Hardware/Software Interface," Morgan Kaufmann Pub, pp. 540-541, Aug. 21, 2004.

(Continued)

*Primary Examiner* — Shawn X Gu
(74) *Attorney, Agent, or Firm* — Oblon, Spivak, McClelland, Maier & Neustadt, L.L.P.

(57) ABSTRACT

A plurality of free-block management lists for respectively managing a logical block with a same bank number, a same chip number, and a same plane number as a free block, and a free block selecting unit that selects a required number of free-block management lists from the free-block management lists to obtain a free block from the selected free-block management lists are provided.

28 Claims, 17 Drawing Sheets

U.S. PATENT DOCUMENTS

| | | |
|---|---|---|
| 2009/0319716 A1 | 12/2009 | Nagadomi |
| 2010/0017562 A1 | 1/2010 | Nagadomi |
| 2010/0037009 A1 | 2/2010 | Yano et al. |
| 2010/0037011 A1 | 2/2010 | Yano et al. |
| 2010/0049907 A1 | 2/2010 | Kitsunal et al. |
| 2010/0223424 A1 | 9/2010 | Kitsunai et al. |
| 2010/0281204 A1 | 11/2010 | Yano et al. |
| 2010/0312948 A1 | 12/2010 | Yano et al. |
| 2010/0313084 A1 | 12/2010 | Hida et al. |
| 2010/0325343 A1 | 12/2010 | Takashima |
| 2011/0022784 A1 | 1/2011 | Yano et al. |
| 2011/0099349 A1 | 4/2011 | Yano et al. |
| 2011/0185105 A1 | 7/2011 | Yano et al. |
| 2011/0231610 A1 | 9/2011 | Yano et al. |

OTHER PUBLICATIONS

International Search Report issued on Apr. 20, 2010, in PCT/JP2010/052480 filed Feb. 12, 2010, English language.

International Written Opinion issued on Apr. 20, 2010, in PCT/JP2010/052480 filed Feb. 12, 2010, English language.

U.S. Appl. No. 12/529,192, filed Oct. 23, 2009, Yano, et al.

U.S. Appl. No. 12/529,228, filed Aug. 31, 2009, Yano, et al.

U.S. Appl. No. 13/107,623, filed May 13, 2011, Kanno, et al.

U.S. Appl. No. 13/152,962, filed Jun. 3, 2011, Yano, et al.

| | Plane0 | Plane1 | Plane0 | Plane1 | | Plane0 | Plane1 |
|---|---|---|---|---|---|---|---|
| | ch0 | | ch1 | | ... | chM | |
| chip K | LBLK0 | LBLK1 | LBLK1 | LBLK1 | | LBLK2 | LBLK2 |
| | LBLK1 | LBLK0 | LBLK0 | LBLK2 | | LBLK1 | LBLK1 |
| | LBLK2 | LBLK2 | LBLK2 | LBLK0 | | LBLK0 | LBLK0 |

| | DOUBLE SPEED MODE PERSPECTIVE | NORMAL MODE PERSPECTIVE |
|---|---|---|
| Bank # 0 | CHIP NUMBER (MARGIN) | CHIP NUMBER + PLANE NUMBER (MARGIN) |
| Bank # 1 | CHIP NUMBER (MARGIN) | CHIP NUMBER + PLANE NUMBER (MARGIN) |
| Bank # 2 | SAME AS ABOVE | SAME AS ABOVE |
| ⋮ | ⋮ | ⋮ |
| Bank # N | SAME AS ABOVE | SAME AS ABOVE |

FIG.17

|  | DOUBLE SPEED MODE PERSPECTIVE | NORMAL MODE PERSPECTIVE |
|---|---|---|
| Bank # 0 | Chip0 (15) | Chip0 Plane1 (20) |
| Bank # 1 | Chip2 (10) | Chip2 Plane0 (30) |
| Bank # 2 | (0) | Chip3 Plane1 (27) |
| Bank # 3 | (0) | Chip2 Plane0 (9) |

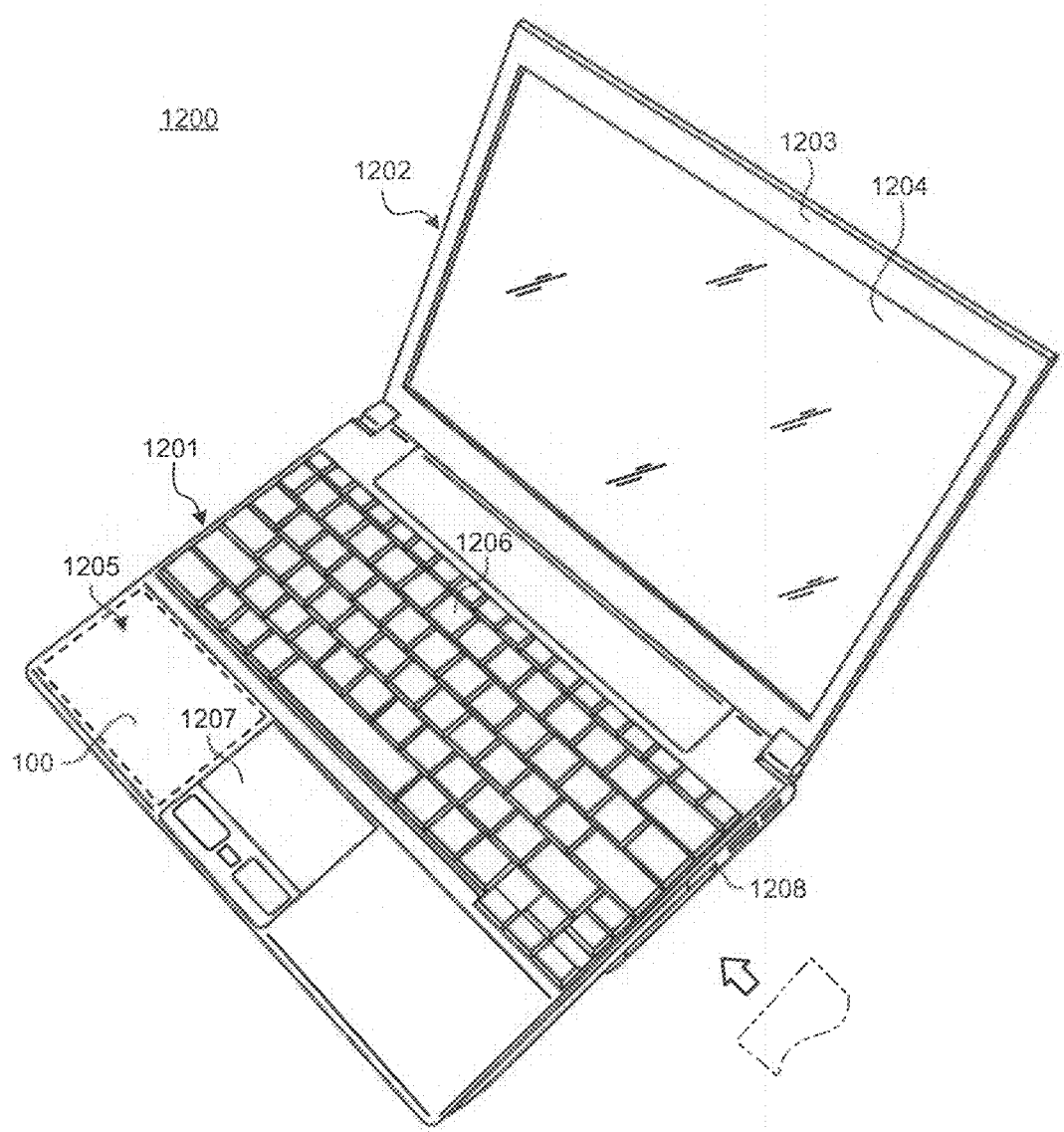

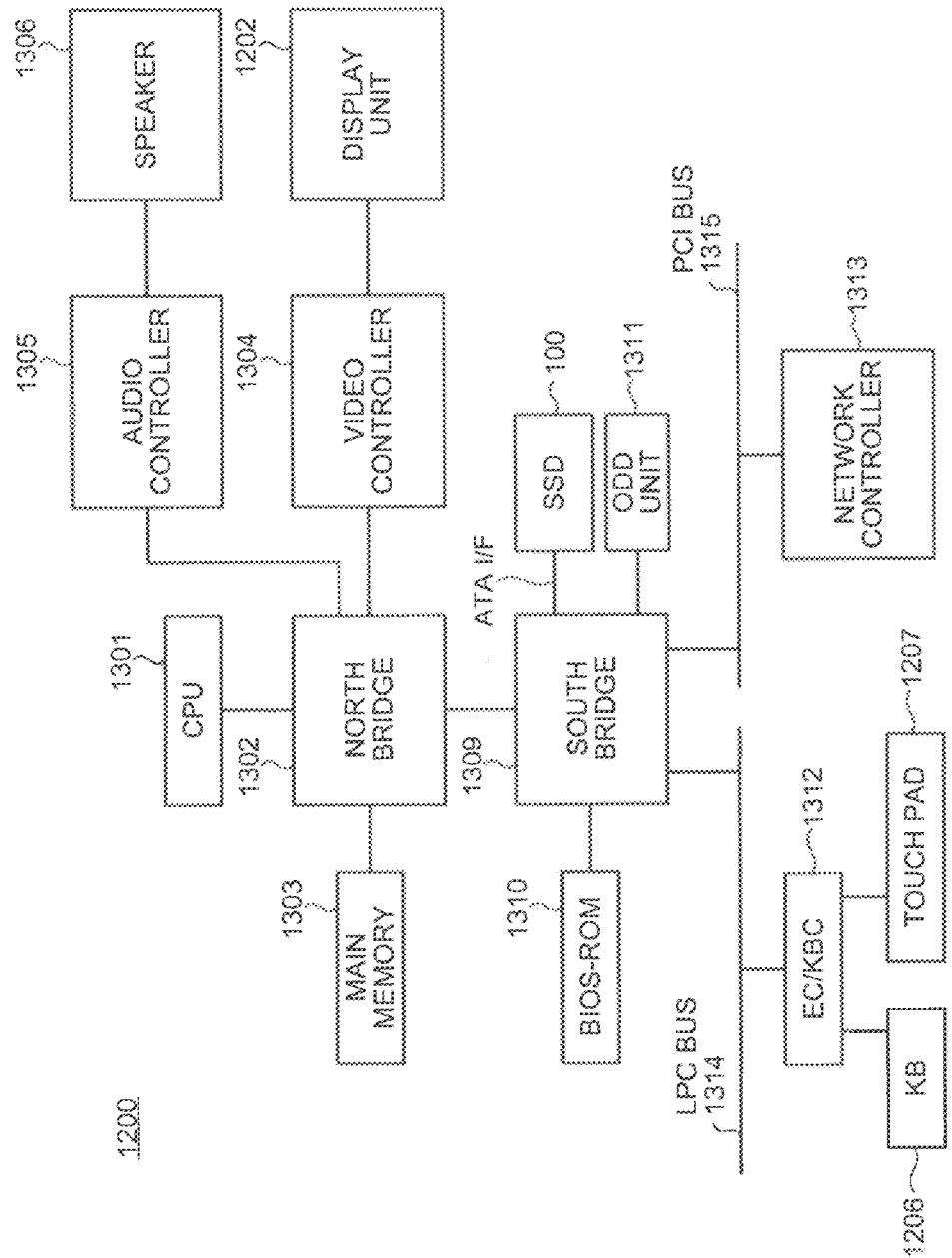

US 8,463,986 B2

MEMORY SYSTEM AND METHOD OF CONTROLLING MEMORY SYSTEM

CROSS-REFERENCE TO RELATED APPLICATIONS

This application is a continuation of PCT international application Ser. No. PCT/JP2010/052480 filed on Feb. 12, 2010 which designates the United States and claims the benefit of priority from Japanese patent application No. 2009-030299 filed on Feb. 12, 2009; the entire contents of which are incorporated herein by reference.

FIELD

Embodiments described herein relate generally to a memory system including a nonvolatile semiconductor memory.

BACKGROUND

Examples of the nonvolatile semiconductor memory include nonvolatile semiconductor memories in which a unit of erasing, writing, and readout is fixed such as a nonvolatile semiconductor memory that, in storing data, once erases the data in block units and then performs writing and a nonvolatile semiconductor memory that performs writing and readout in page units in the same manner as the NAND-type flash memory.

On the other hand, a unit for a host apparatus such as a personal computer (PC) to write data in and read out the data from a secondary storage device such as a hard disk is called sector. The sector is set independently from a unit of erasing, writing, and readout of a semiconductor storage device. Normally, a size of a sector (sector size) of a host apparatus is smaller than a size of a block (block size) or a size of a page (page size) of the nonvolatile semiconductor memory.

Therefore, when the secondary storage device of the PC such as the hard disk is configured by using the nonvolatile semiconductor memory, it is necessary to write data with a small size from the PC as the host apparatus by adapting the size to the block size and the page size of the nonvolatile semiconductor memory.

The data recorded by the host apparatus such as the PC has both temporal locality and spatial locality (see, for example, Non-Patent Document 1: David A. Patterson and John L. Hennessy, "Computer Organization and Design: The Hardware/Software Interface", Morgan Kaufmann Pub, Aug. 31, 2004). Therefore, when data is recorded, if the data is directly recorded in an address designated from the outside, rewriting, i.e., erasing processing temporally concentrates in a specific area and a bias in the number of times of erasing increases. Therefore, in the NAND-type flash memory, processing called wear leveling for equally distributing data update sections is performed. In the wear leveling processing, for example, a logical address designated by the host apparatus is translated into a physical address of the nonvolatile semiconductor memory in which the data update sections are equally distributed.

When a large-capacity secondary memory device is configured by using a NAND-type flash memory, if a unit of data management is small (for example, the page size) at the time of performing address translation, a size of a management table increases and cannot be housed in a main storage memory of a controller of the secondary memory device, thereby causing a problem in that address translation cannot be performed at a high speed. Thus, as capacity of the NAND-type flash memory as the secondary memory device increases, the size of the management table increases consequently, and thus a method of decreasing the capacity of the management table as much as possible has been desired.

BRIEF DESCRIPTION OF THE DRAWINGS

FIG. 4 is a diagram illustrating a physical configuration of the NAND memory;

FIG. 7 is a conceptual diagram of a logical block configuration in a comparative example when there is no parallel operation by banks;

FIG. 17 is a diagram illustrating an example of registered data of a margin table;

FIG. 19 is a perspective view of an exterior of a PC according to a fourth embodiment of the present invention; and FIG. 20 is a diagram illustrating a functional configuration example of the PC according to the fourth embodiment.

DETAILED DESCRIPTION

Figure 1:
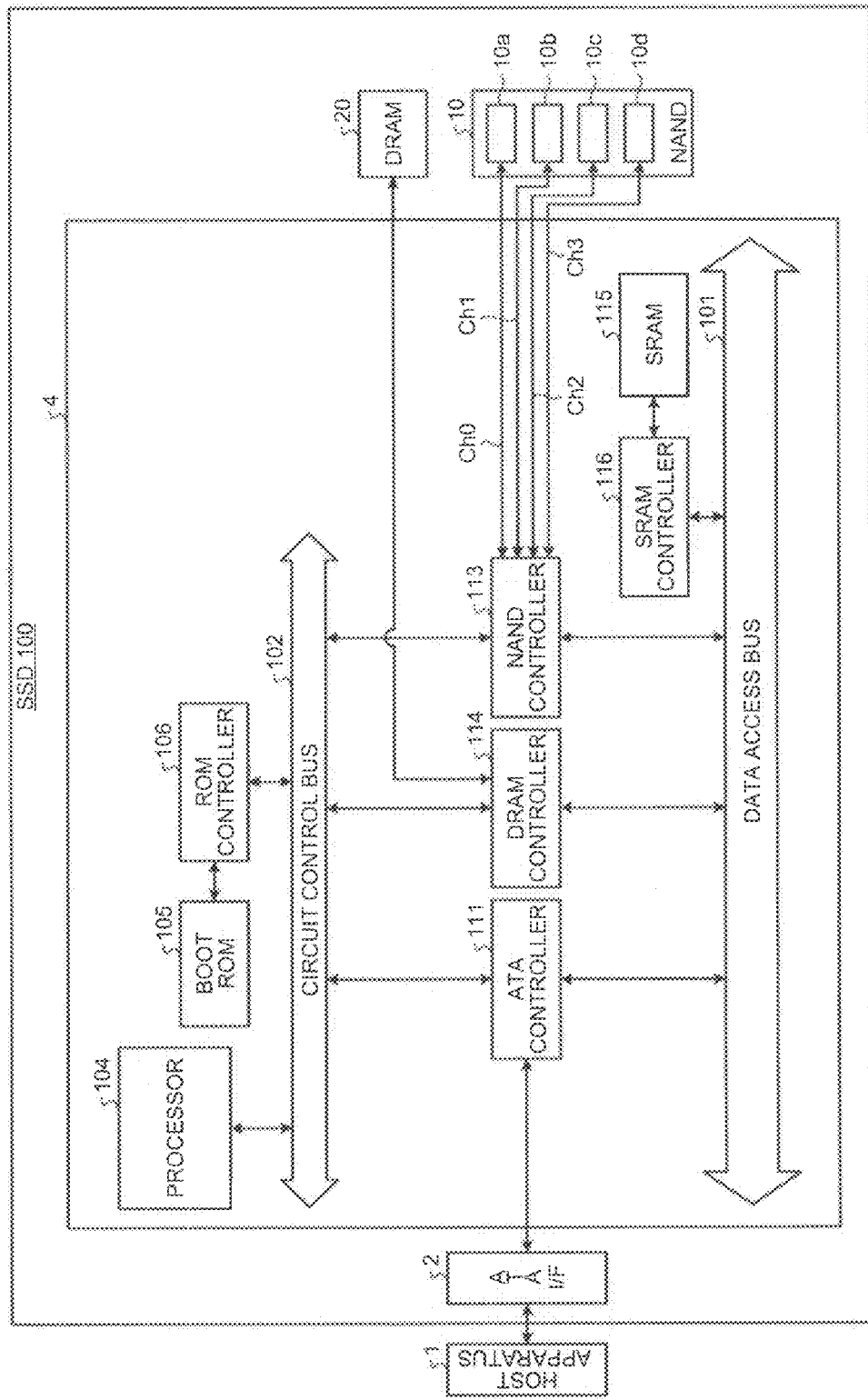
FIG. 1 is a block diagram of a configuration example of an SSD.

In general, according to one embodiment, memory system and method of controlling memory system includes a memory system comprising: a nonvolatile semiconductor memory having a plurality of channel parallel operation elements including a plurality of memory chips, in which each memory chip is divided into a plurality of planes capable of operating in parallel, each plane includes a plurality of physical blocks as a unit of data erasing, and the memory chips in the respective channel parallel operation elements operated in parallel are divided into a plurality of banks, which respectively shares a ready/busy signal, over the channel parallel operation elements; and a controller that manages a free block based on a logical block associated with the physical blocks selected from the channel parallel operation elements operated in parallel and controls a parallel operation by the planes, banks, or channel parallel operation elements. The controller includes: a plurality of free-block management lists in which the logical blocks with a same bank number, a same chip number, and a same plane number are respectively managed as the free blocks; and a free block selecting unit that selects a required number of free-block management lists from the free-block management lists to obtain a free block from selected free-block management lists.

As for deterioration of cells of the flash memory, an amount of erasing of the block of the flash memory to be required with respect to an amount of write data from the host apparatus becomes an important factor. The amount of erasing of the block with respect to the amount of write data from the host apparatus is referred to as writing efficiency, and a smaller value thereof is better. Generally, in the NAND-type flash memory, erasing processing and write processing of the block require a long time. Therefore, bad writing efficiency means that there are lots of erasings of the block and writings into an erased block with respect to the amount of data writing from the host apparatus, and consequently, speed performance of the flash memory deteriorates. Thus, a method of improving the writing efficiency by bringing the amount of write data with respect to the flash memory close to the amount of erasing of the block has been desired.

Therefore, improvement of the writing efficiency and high speed by parallel processing are realized by introducing a concept of a virtual block in which a plurality of physical blocks, which is a unit of erasing, is combined (for example, see Patent Document 1: Japanese patent application National Publication No. 2007-517325), and performing erasing/writing/readout in parallel in units of virtual block.

However, the method of constituting the virtual block by physical blocks, that is, the method of combining the physical blocks often has a restriction. When the size of the virtual block is too large, too many physical blocks are used uselessly even when it is desired to store a small amount of data, thereby deteriorating the writing efficiency.

Exemplary embodiments of a memory system according to the present invention will be explained below in detail with reference to the accompanying drawings. The present invention is not limited to the embodiments.

First Embodiment

FIG. 1 is a block diagram of a configuration example of a solid state drive (SSD) 100. The SSD 100 includes a memory connection interface such as a drive control circuit 4 as a controller, a NAND-type flash memory (hereinafter, "NAND memory") 10 as a nonvolatile semiconductor memory, a dynamic random access memory (DRAM) 20 as a nonvolatile semiconductor memory, and an advanced technology attachment interface (ATA I/F) 2. The SSD 100 is connected to a host apparatus (hereinafter, "host") 1 such as a PC or a central processing unit (CPU) core via the ATA I/F 2 and functions as an external memory of the host apparatus 1.

The NAND memory 10 stores user data specified by the host 1 and stores management information managed by the DRAM 20 for backup. The NAND memory 10 has a memory cell array, in which a plurality of memory cells are arrayed in a matrix, and the individual memory cell can store multiple values by using an upper page and a lower page. The NAND memory 20 includes a plurality of memory chips, and each memory chip is constituted by arraying a plurality of physical blocks, which is a unit of data erasing. The NAND memory 10 writes and reads data for each physical page. The physical block includes a plurality of physical pages. In FIG. 1, the NAND memory 10 is connected to a NAND controller 113 in the drive control circuit 4 in parallel via four channels (4 ch: ch0 to ch3) and can operate four channel parallel operation elements 10a to 10d in parallel. The number of channels is not limited to four and an arbitrary number of channels can be used.

The DRAM 20 is used as a storage unit for data transfer, storage of management information, or a work area. Specifically, as the storage unit for data transfer (a cache for data transfer), the DRAM 20 is used for temporarily storing data write-requested from the host 1 before writing the data into the NAND memory 10 or reading data read-requested from the host 1 from the NAND memory 10 and temporarily storing the data. As the storage unit for storage of the management information, the DRAM 20 is used for storing management information for managing a location of data to be stored in the NAND memory 10 (a master table in which various management tables stored in the NAND memory 10 are loaded at the time of startup, a log which is change and difference information of the management table, or the like).

The drive control circuit 4 performs data transfer control between the host 1 and the NAND memory 10 via the DRAM 20 and controls respective components in the SSD 100.

The drive control circuit 4 includes a data access bus 101 and a circuit control bus 102. A processor 104 that controls the entire drive control circuit 4 is connected to the circuit control bus 102. A boot ROM 105, in which a boot program for booting respective management programs (FW: firmware) stored in the NAND memory 10 is stored, is connected to the circuit control bus 102 via a ROM controller 106.

An ATA interface controller (ATA controller) 111, the NAND controller 113, and a DRAM controller 114 are connected to both the data access bus 101 and the circuit control bus 102. The ATA controller 111 transfers data to and from the host 1 via the ATA interface 2. A static random access memory (SRAM) 115 used as a data work area and a firmware expansion area is connected to the data access bus 101 via an SRAM controller 116. When the firmware stored in the NAND memory 10 is started, the firmware is transferred to the SRAM 115 by the boot program stored in the boot ROM 105.

The DRAM controller 114 executes interface processing and the like between the processor 104 and the DRAM 20. The NAND controller 113 executes the interface processing between the processor 104 and the NAND memory 10, data transfer control between the NAND memory 10 and the DRAM 20, encode/decode processing of an error correction code, and the like.

Figure 2:
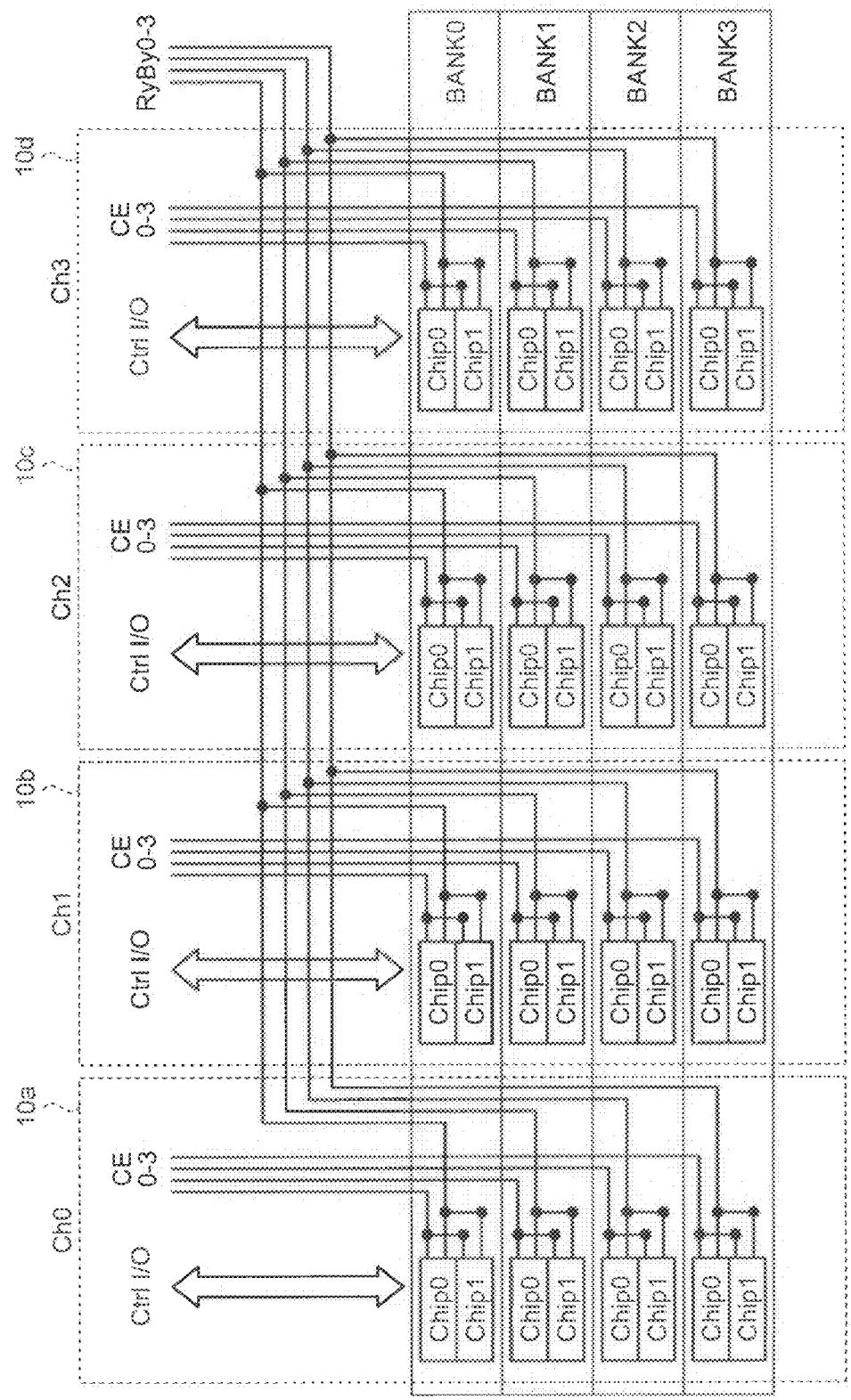
FIG. 2 is a diagram illustrating a connection mode between a NAND controller and a NAND memory.

FIG. 2 depicts a connection mode between the NAND controller 113 and the NAND memory 10. The NAND memory 10 includes the channel parallel operation elements 10a to 10d. The respective channel parallel operation elements 10a to 10d include a plurality of banks capable of performing bank interleave (in FIG. 2, four banks, Bank 0 to Bank 3), and each bank in the respective channel parallel operation elements 10a to 10d includes a plurality of memory chips (in FIG. 2, two memory chips, Chip 0 and Chip 1).

As shown in FIG. 2, the NAND controller 113 includes a plurality of channels, and each channel individually controls memory chips sharing a control I/O signal (Ctrl I/O) by four chip enable signals (CE) for each bank. The NAND controller 113 shares four ready/busy signals (RyBy) spanning over the channels to control so that the memory chips of each channel sharing the ready/busy signal (RyBy) operate at the same time. A memory chip group sharing the ready/busy signal (RyBy) is referred to as a bank, and the plurality of banks can independently perform writing/readout/erasing operations.

Figure 3:
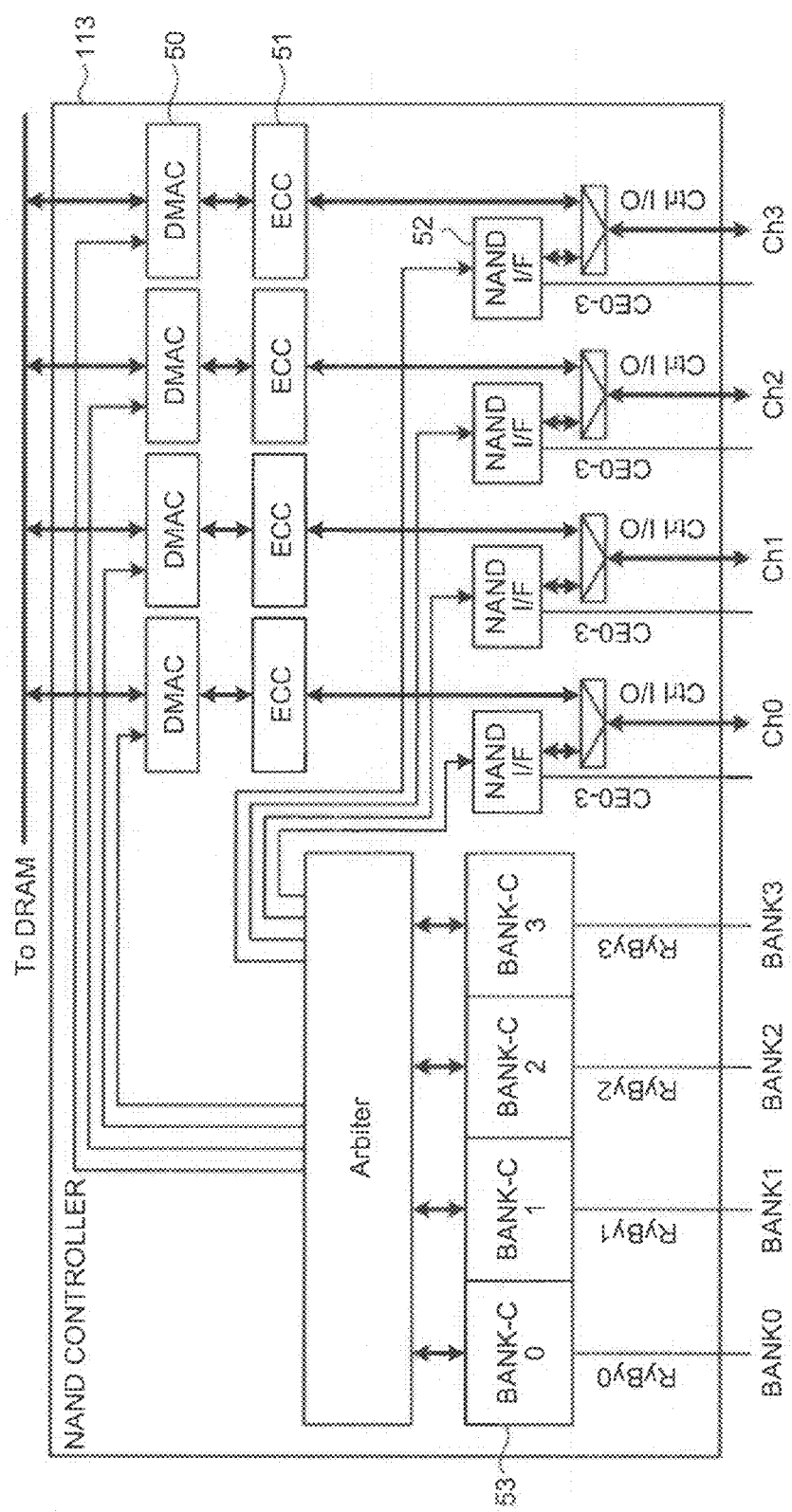
FIG. 3 is a block diagram of an internal configuration example of the NAND controller.

FIG. 3 is an internal configuration example of the NAND controller 113. The NAND controller 113 includes a DMA controller (DMAC) 50, an error correction circuit (ECC) 51, and a NAND interface (NAND I/F) 52 that issues a command, so that each channel operates independently. CE signal (CE0 to CE3) control lines for four banks are connected to each NAND I/F 52 to control the CE signals (CE0 to CE3) corresponding to the bank to be accessed. The NAND controller 113 includes four bank controllers (BANK-C) 53 that monitor the RyBy signal commonly connected for each bank to control the condition of the bank for independently operating the four banks. The BANK-C 53 has a function of queuing requests to the respective banks to ensure a right of use of the channel when there is a request to each bank, and executes readout/writing/erasing requests with respect to the bank managed by the own BANK-C 53.

Figure 4:
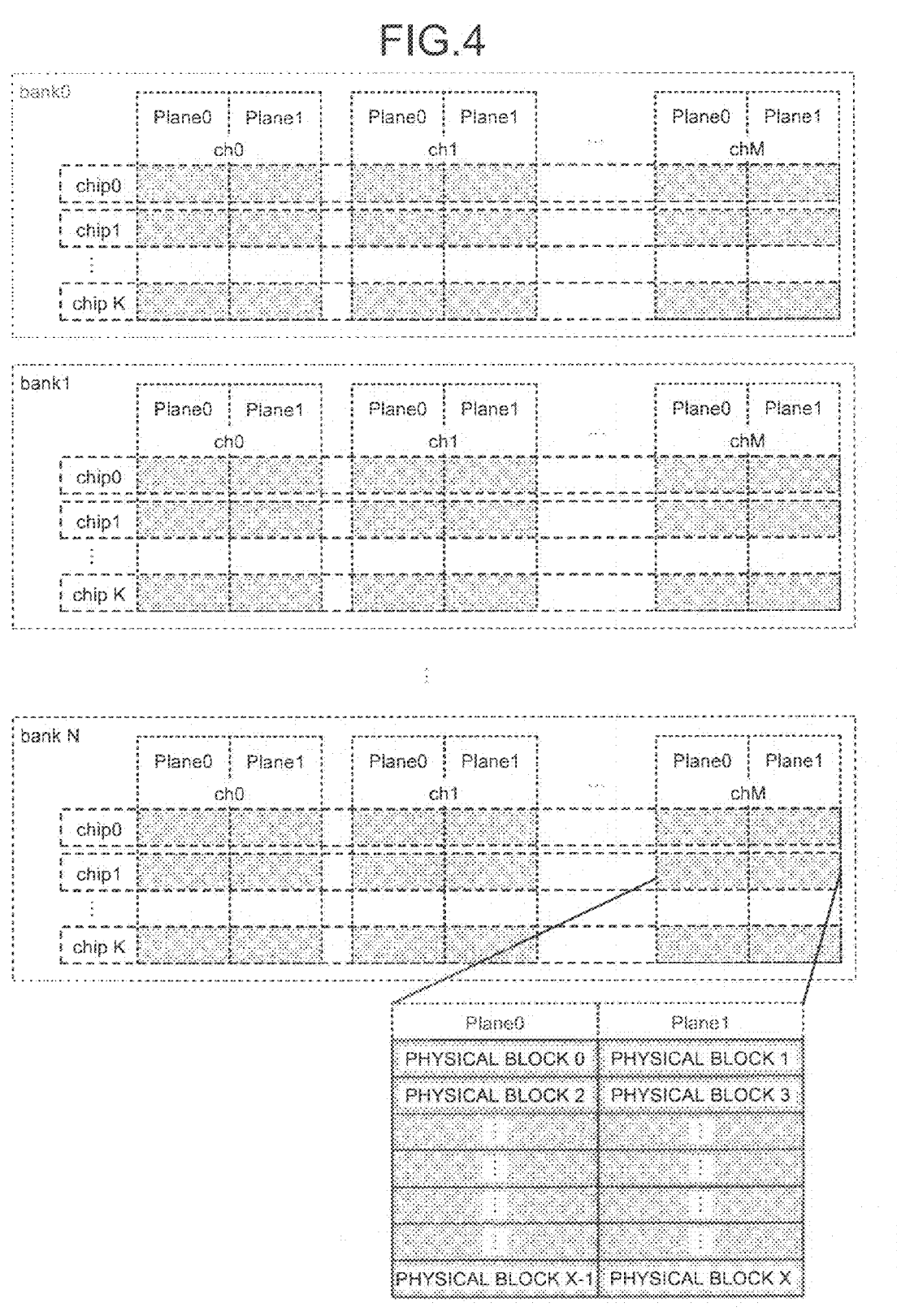

FIG. 4 depicts a detailed inner configuration of the NAND memory 10. In FIG. 4, the number of channels is indicated as (M+1), the number of banks is indicated as N+1, and the number of chips is indicated as K+1. As shown in FIG. 4, for example, each of the memory chips (chip 0 to chip K) is divided into two districts of plane 0 and plane 1 each including a plurality of physical blocks. The plane 0 and the plane 1 include peripheral circuits independent from each other (e.g., a row decoder, a column decoder, a page buffer, and a data cache), and can simultaneously perform erasing, writing, and readout by using a double speed mode. The number of planes in one memory chip is not limited to two and is arbitrary. As shown in FIG. 4 in an enlarged scale, one memory chip includes a plurality of physical blocks (in FIG. 4, X+1 physical blocks).

In this way, in the NAND memory 10, a parallel operation by a plurality of channels, a parallel operation by a plurality of banks, and a parallel operation in the double speed mode using a plurality of planes can be performed, and when the number of channels is four, the number of banks is 4, and the number of planes is 2, up to 32 physical blocks can be operated in parallel.

Figure 5:
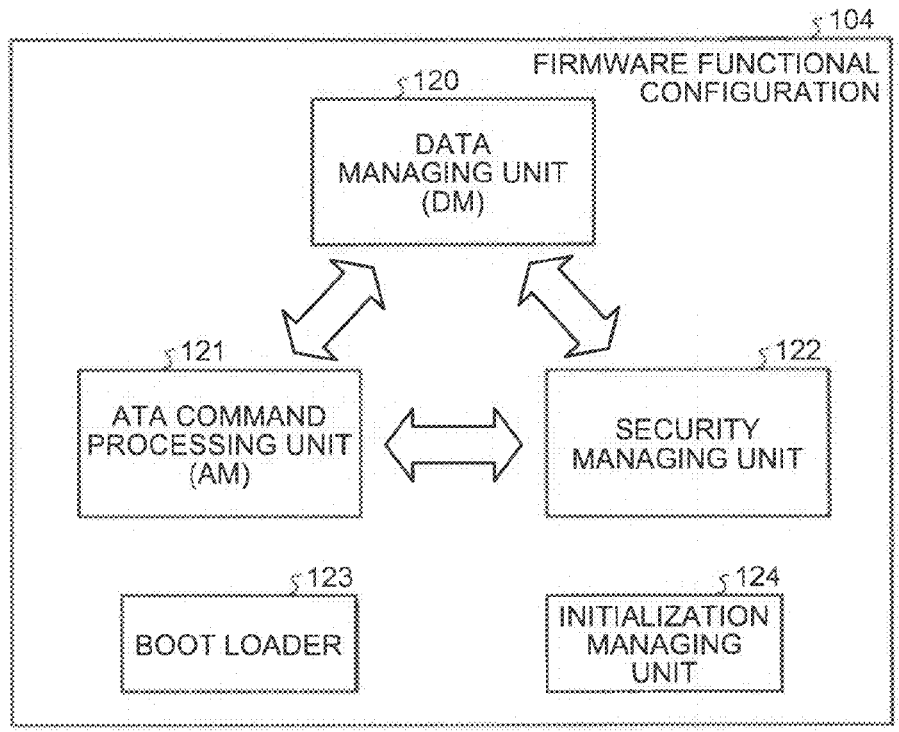
FIG. 5 is a block diagram of a functional configuration example of a processor.

FIG. 5 is a block diagram of a functional configuration example of firmware realized by the processor 104. Functions of the firmware realized by the processor 104 are roughly classified into a data managing unit (DM: data manager) 120, an ATA-command processing unit 121 (AM: ATA manager), a security managing unit 122, a boot loader 123, and an initialization managing unit 124.

The data managing unit 120 controls data transfer between the NAND memory 10 and the DRAM 20 and various functions of the NAND memory 10 via the NAND controller 113, the DRAM controller 114, and the like. The ATA-command processing unit 121 performs data transfer between the DRAM 20 and the host 1 in cooperation with the data managing unit 120 via the ATA controller 111 and the DRAM controller 114. The security managing unit 122 manages various kinds of security information in cooperation with the data managing unit 120 and the ATA-command processing unit 121.

The boot loader 123 loads, when a power supply is turned on, the management programs (firmware) from the NAND memory 10 onto the SRAM 115. The initialization managing unit 124 performs initialization of respective controllers and circuits in the drive control circuit 4.

The data managing unit 120 performs, for example, provision of functions that the ATA-command processing unit 121 requests the NAND memory 10 and the DRAM 20 as storage devices (in response to various commands such as a write request, a cache flush request, and a read request from the host 1), management of a correspondence relation between a logical address given from the host 1 and the NAND memory 10, protection of management information by a snapshot and a log, provision of fast and highly efficient data readout and writing functions using the DRAM 20 and the NAND memory 10, and ensuring of reliability of the NAND memory 10.

Figure 6:
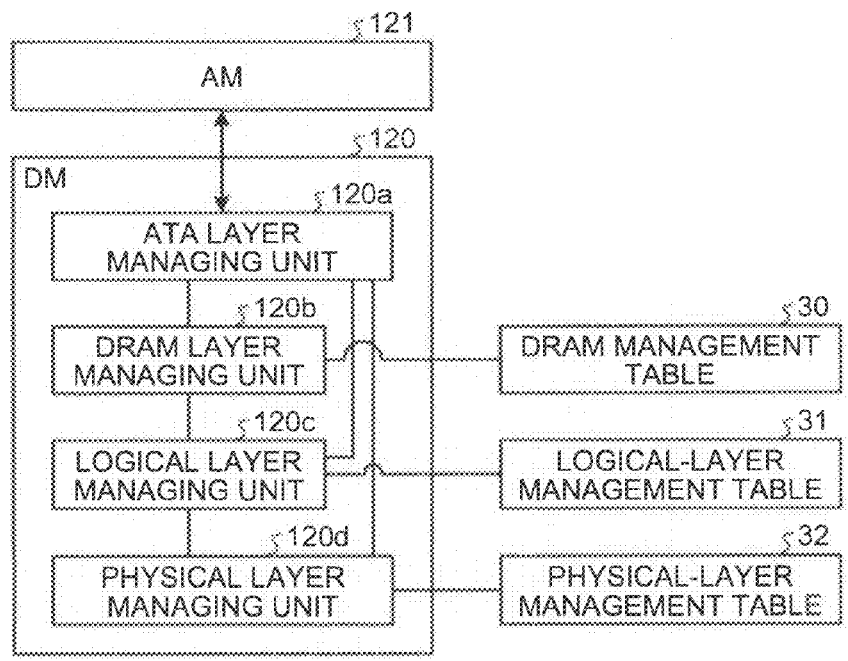
FIG. 6 is a block diagram of a functional configuration of a data managing unit.

In the data managing unit 120, as shown in FIG. 6, a multilayered management configuration is adopted, and the data managing unit 120 includes an ATA layer managing unit 120a, a DRAM layer managing unit 120b, a logical layer managing unit 120c, and a physical layer managing unit 120d in this order from the top layer.

The ATA layer managing unit 120a receives a request from the ATA-command processing unit 121 to response to the request, and notifies an appropriate lower layer managing unit of the request. The DRAM layer managing unit 120b uses a DRAM management table 30 to manage the data on the DRAM 20.

At the time of issuing a Read or Write request to the SSD 100, the host 1 inputs a logical block addressing (LBA) as a logical address and data size via the ATA interface 2. The LBA is a logical address with a serial number from 0 in which serial numbers from 0 are attached to sectors (size: 512 B). A virtual block referred to as the logical block is constituted by combining a plurality of physical blocks in the NAND memory 10. The individual physical block constituting the logical block can operate in parallel, and erasing, writing, and readout are simultaneously executed. In a present embodiment of the present invention, the logical block is basically constituted by selecting one physical block from different channels. Details of how to combine the physical blocks constituting the physical block will be described later.

The logical layer managing unit 120c uses various logical-layer management tables 31 to manage the data on the NAND memory 10, and executes:

Management of correspondence between the LBA and the logical block;

Data write control from the DRAM 20 to the NAND memory 10;

Data read control from the NAND memory 10 to the DRAM 20; and

Organizing of user data in the NAND memory 10.

The physical layer managing unit 120d uses various physical-layer management tables 32 to manage the NAND memory 10, and executes provision of the logical block, management of nonvolatile information, control of the NAND controller 113, and the like. Specifically, the physical layer managing unit 120d executes:

Management of a free block, bad block, and active block;

Management of correspondence between the logical block and the physical block;

Management of a physical error;

Wear leveling and refresh;

Management of the nonvolatile management information (snapshot, log); and

Control of the NAND controller 113.

The free block (FB) is a logical block which does not include valid data therein and to which a use is not allocated yet. The active block (AB) is a logical block, to which a use is allocated. The bad block (BB) is a physical block that cannot be used as a storage area because of a large number of errors. For example, a physical block for which an erasing operation is not normally finished is registered as the bad block BB.

The LBA used by the host 1 can be associated with a logical NAND address (logical block address or the like) used by the SSD 100 and a physical NAND address (physical block address or the like) used by the NAND memory 10 by the management information managed by the respective management tables 30, 31, and 32 shown in FIG. 6, and the data can be transferred between the host 1 and the NAND memory 10. A technology for associating an LBA with a logical NAND address and associating a logical NAND address with a physical NAND address in this manner is disclosed, for example, in International patent application PCT/JP09/052, 598, and the whole content thereof is incorporated in the present application.

Essential parts of the present embodiment are explained next. In the apparatus, the parallel operation by the channels, the parallel operation by the banks, and the parallel operation by the double speed mode using the planes can be performed, and the physical blocks can be processed in parallel by using the parallel operations. In the present embodiment, how to combine the physical blocks constituting the logical block is optimized to efficiently perform the respective parallel operations and improve the writing efficiency.

A configuration method of the logical block according to a comparative example is explained first. For example, it is considered that the logical block is configured so that the maximum parallelism can be always ensured with respect to the SSD having a physical configuration shown in FIG. 4. In the comparative example, restriction in the selection of the physical block when the maximum parallelism is preferentially ensured is explained with reference to FIGS. 7 and 8.

Comparative Example

In the SSD according to the comparative example, restrictions of from (1) to (3) are provided with respect to how to combine the physical blocks constituting the logical block.

(1) The physical blocks to be selected from the channel parallel operation elements (10a to 10d) are the ones belonging to memory chips with the same chip number (chip 0 to chip K).

(2) To be a combination of plane 0 and plane 1 in a channel.

(3) To satisfy the restrictions (1) and (2) in each bank.

When the restrictions (1) to (3) are satisfied, the parallel operations by the channels, planes, and banks can be performed. A case that there is no parallel operation by the banks and a case that there are parallel operations by the banks are compared with each other. When there is no parallel operation by the banks, as shown in FIG. 7, two physical blocks (plane 0/plane 1) are selected from all the channels having the same chip number while satisfying the restrictions (1) and (2) to constitute the logical block. In FIG. 7, one logical block LBLK0 is constituted of the physical blocks for the number of channels and the number of planes, and one logical block LBLK1 is constituted of the physical blocks in the same manner. Such a configuration example of a logical block is disclosed, for example, in International patent application PCT/JP09/052,595, and the whole content thereof is incorporated in the present application.

Figure 8:
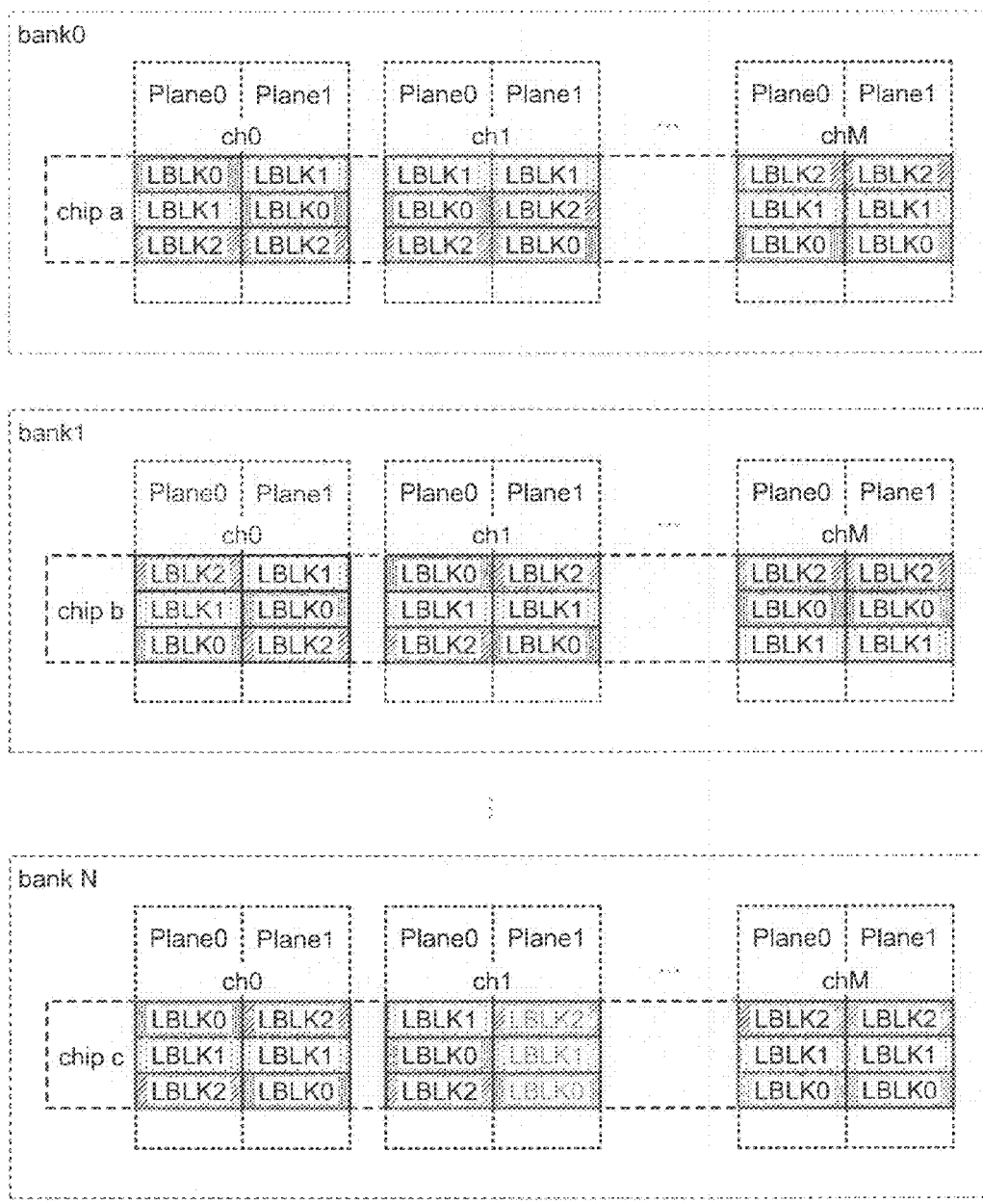
FIG. 8 is a conceptual diagram of the logical block configuration in the comparative example when there are parallel operations by banks.

On the other hand, when there are parallel operations by the banks, as shown in FIG. 8, two physical blocks (plane 0/plane 1) are selected from all the channels having the same chip number to constitute the logical block with respect to all the banks (bank 0 to bank N). In FIG. 8, one logical block LBLK0 is constituted of physical blocks for the number of channels, the number of planes, and the number of banks, and one logical block LBLK1 is constituted of the physical blocks in the same manner. Thus, when there are parallel operations by the banks, the number of physical blocks that constitute the logical block (that is, operates simultaneously) increases by the times of the number of banks, as compared to the case that there is no parallel operation.

As described above, the correspondence between the logical block and the physical block is managed by the physical layer managing unit 120d. The logical block includes the free block FB, the active block AB, and the like, however, the free block FB which does not include the valid data therein, to which a use has not been allocated yet, is managed according to an FB management list. The FB management list is in an FIFO format sorted in order of becoming the free bock FB, and a logical block ID is held in each entry. The free block FB returned from the logical layer managing unit 120c is added to the last of the FB management list, and the top logical block in the FB management list is taken at the time of transmitting the logical block to the logical layer managing unit 120c. In the FB management list, the wear leveling for roughly equalizing the number of times of erasing of all the logical blocks and intervals between erasings is performed.

When there is no parallel operation by the banks, there is little problem even if the FB management list is constituted of one list. However, when there are parallel operations by the banks, because the number of physical blocks that constitute the logical block (that is, operate simultaneously) increases by the times of the number of banks, lots of physical blocks are used uselessly even when it is desired to store a small amount of data, thereby deteriorating the writing efficiency. Deterioration of the writing efficiency means an increase of the number of times of erasing and writing with respect to the memory cell, and thus the service life of the entire system may be decreased. Thus, writing speed (=parallelism) and the writing efficiency are in a trade-off relation.

Therefore, in the present embodiment, an increase in the number of physical blocks constituting the logical block is suppressed, and the parallelism is controlled according to the number of logical blocks required for processing a write request. When the parallelism is not required, the writing efficiency is given priority. Therefore, the SSD 100 according to the present embodiment includes a plurality of FB management lists, and in each FB management list, the logical blocks having the same bank number, chip number, and plane number are managed. A method of constituting the logical block and a method of controlling the parallelism in the SSD 100 according to the present embodiment are explained below in detail.

Figure 9:
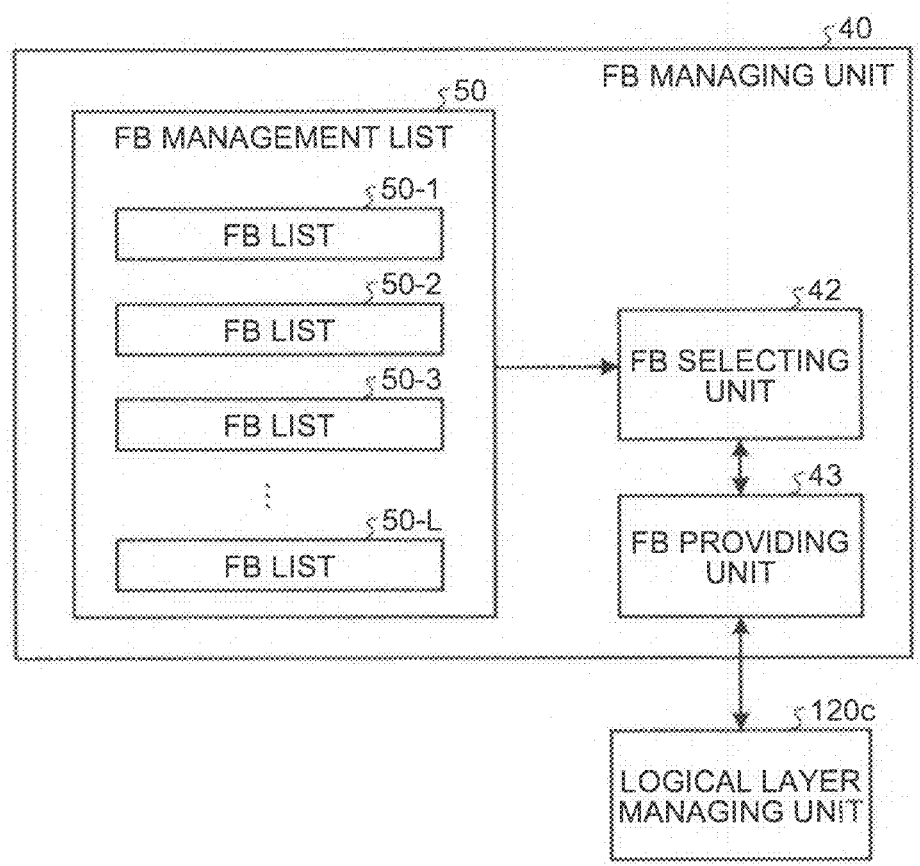
FIG. 9 is a diagram illustrating a configuration example of an FB managing unit according to a first embodiment of the present invention.

FIG. 9 depicts a configuration of an FB managing unit 40 that manages the free block FB. The FB managing unit 40 includes an FB management list 50 including a plurality of FB lists 50-1 to 50-L, an FB selecting unit 42, and an FB providing unit 43, and is realized as, for example, a functional block provided by the physical layer managing unit 120d. The FB providing unit 43 notifies the FB selecting unit 42 of required information such as the number of logical blocks in response to a request from the logical layer managing unit 120c or the like. The FB selecting unit 42 selects the required number of logical blocks (logical block ID) from the FB lists 50-1 to 50-L in the FB management list 50 based on the number of logical blocks notified from the FB providing unit 43, and notifies the FB providing unit 43 of selected one or plurality of logical block IDs. The FB providing unit 43 notifies the logical layer managing unit 120c of the notified one or plurality of logical block IDs as the free block FB.

Figure 10:
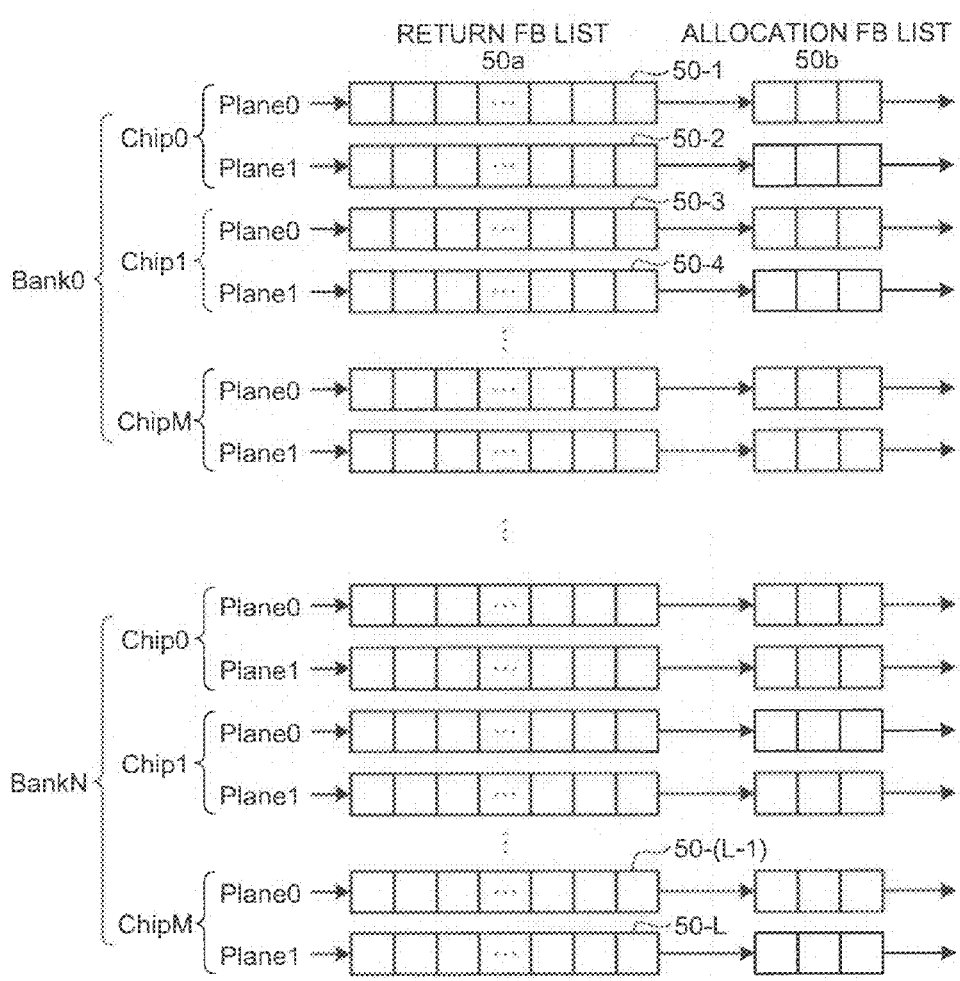
FIG. 10 is a diagram illustrating an FB management list.

FIG. 10 depicts a plurality of FB lists 50-1 to 50-L constituting the FB management list 50. The logical block IDs of the logical blocks having the same bank number/chip number/plane number are entered in the respective FB lists 50-1 to 50-L. The FB lists 50-1 to 50-L have a two-stage configuration including a return FB list 50a and an allocation FB list 50b. The logical block ID is recorded in each entry.

The return FB list 50a is aligned in order of erasing time, and the logical block having less number of times of erasing is positioned at the top of the list. This is for preventing repetition of the erasing operation with a short time interval. A non-required logical block returned from the logical layer managing unit 120c is added to the last of the return FB list 50a and held therein for a certain period. The logical block pushed out from the return FB list 50a is inserted into a middle of the allocation FB list 50b according to the number of times of erasing. When obtaining the logical block, the FB selecting unit 42 takes out the logical block from the top of the allocation FB list 50b to allocate the logical block. The logical block as the FB taken out from the allocation FB list 50b is registered as the active block (AB), to which a use is allocated.

Because the FB lists have the two-stage configuration with the return FB list 50a and the allocation FB list 50b, the logical block to be erased can be equally distributed (wear leveling) so that the number of times of erasing and an erasing interval of all the logical blocks become roughly the same. The service life of the NAND-type flash memory depends on the erasing interval as well as the number of times of erasing, and it is known that as the interval becomes longer, a retention property is improved, and the service life can be extended. This indicates that if the erasing interval is short, the retention property deteriorates, and the service life is decreased. It is also known that even if writing is performed with a short interval, the retention property is recovered if corresponding erasing is not performed for a long time. A technology related to such wear leveling processing is disclosed, for example, in International patent application PCT/JP08/066,508, and the whole content thereof is incorporated in the present application.

Figure 11:
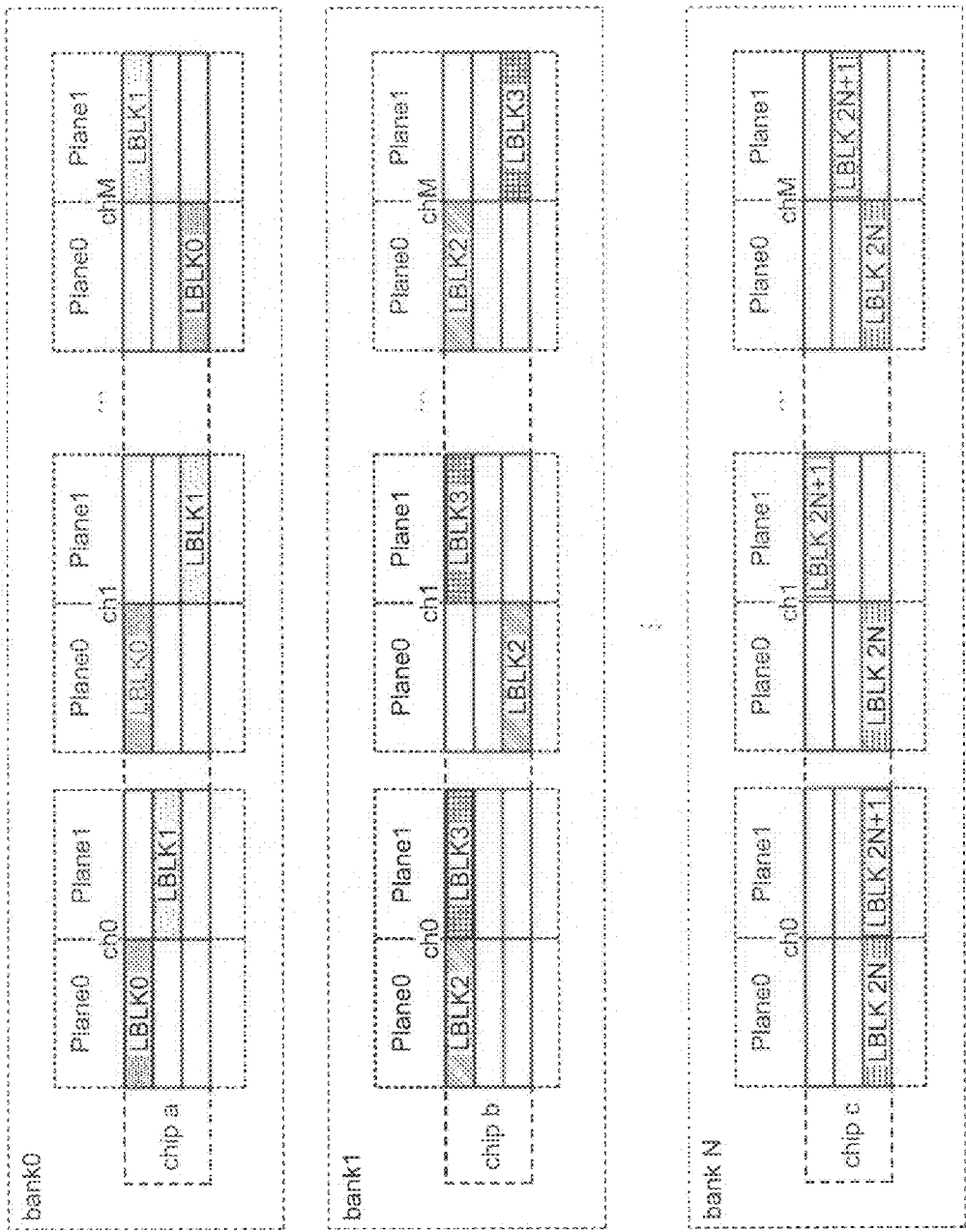
FIG. 11 is a conceptual diagram of a configuration of a logical block according to the first embodiment.

In the present embodiment, as shown in FIG. 11, the logical block is constituted by collecting the physical blocks having the same bank number/chip number/plane number from the respective channels. That is, in the present embodiment, restrictions of from (1) to (4) below are set regarding how to combine the physical blocks constituting the logical block.

(1) To select one physical block of each channel.
(2) To select a physical block of each channel from physical blocks belonging to the same chip number.
(3) To select a physical block of each channel from physical blocks belonging to the same plane number.
(4) To select a physical block in the same bank.

Accordingly, the logical block can be classified for each bank, for each chip, and for each plane. As shown in FIG. 10, the respective FB lists 50-1 to 50-L are configured as a list of logical blocks having the same bank number/chip number/plane number.

The FB selecting unit 42 determines a combination of the lists for obtaining one or a plurality of free blocks FB capable of performing a parallel operation from the FB lists 50-1 to 50-L according to a request from the FB providing unit 43. In the case of a logical block configuration shown in FIG. 11, taking the double speed mode into consideration when the maximum parallelism is required, the FB selecting unit 42 selects the followings.

(1) A logical block of plane 0 and plane 1 with the same chip number in one bank. Accordingly, the FB selecting unit 42 selects, for example, one logical block (LBLK0) belonging to "chip a" for channels belonging to plane 0 and one logical block (LBLK1) belonging to "chip a" for channels belonging to plane 1 with regard to bank 0, thereby selecting two logical blocks.

(2) Logical blocks (LBLK0 to LBLK2N+1) for 2×number of banks (N+1) by performing the same processing as described above with respect to all the banks. Accordingly, parallel writing with respect to the logical blocks (LBLK0 to LBLK2N+1) for 2×number of banks (N+1) can be performed.

On the other hand, when one logical block is requested from the FB providing unit 43, the FB selecting unit 42 selects one list from the FB lists 50-1 to 50-L, and obtains a free block FB from the selected list to select one logical block, for example, from the logical blocks LBLK0 to LBLK2N+1. Thus, because the parallelism used for actual writing can be determined according to the required parallelism, the writing efficiency is not deteriorated even when a small amount of data is written.

The number of logical blocks required by the FB providing unit 43 is not limited to the number of logical blocks corresponding to the maximum parallelism or one, which is the minimum number of logical blocks, and an arbitrary value from 1 to the number of logical blocks corresponding to the maximum parallelism can be taken. The FB selecting unit 42 selects a list from the FB lists 50-1 to 50-L according to the requested arbitrary number of logical blocks, to obtain a free block FB from the selected list.

An algorithm for selecting a list for obtaining an FB from the FB lists 50-1 to 50-L is explained next. Two algorisms (first algorism and second algorism) are explained below.

In the first algorism, a list (bank/chip/plane) for obtaining a free block FB is selected by a round-robin method weighted by a value inversely corresponding to the number of bad blocks BB (number of BBs) generated in each bank/chip/plane (for example, a reciprocal of the number of BBs), the number of logical blocks usable in each bank/chip/plane (sum total of the number of free blocks FB and the number of active blocks AB), and the number of blocks belonging to the respective FB lists. That is, a round-robin method weighted to increase probability for obtaining a free block FB as the number of BBs becomes less is adopted. The bad block BB is a physical block that cannot be used as a storage area because of a large number of errors, and for example, a physical block for which the erasing operation has not normally finished is registered as the bad block BB.

The active block AB in which there is no valid data as update data is written is registered as a free block FB and waits for being reused as the active block AB again. In the bank/chip/plane having the increasing number of BBs, the number of usable logical blocks (the sum total of the number of free blocks FB and the number of active blocks AB) decreases. If the free block FB is obtained with the same probability regardless of the number of usable logical blocks BB, an interval of use until reuse is reduced in the FB list 50 in which the number of logical blocks decreases due to frequent generation of the bad blocks BB. In the NAND-type flash memory, reduction of the interval of reuse (relaxation time) should be avoided because it shortens the service life. In the round-robin method weighted by the number of BBs, the relaxation time can be leveled regardless of the number of logical blocks.

In the second algorithm, an independent round-robin method is adopted between the banks and in the bank. A non-weighted round-robin method is adopted between the banks, so that a free block FB of a different bank can be obtained each time. Because a priority level is not provided between the banks (a free block of a different bank can be obtained each time), the parallelism for at least the number of banks can be achieved. In the bank, as in the first algorithm, a list (chip/plane) for obtaining the free block FB is selected by the round-robin method weighted by a value inversely corresponding to the number of BBs generated in each bank/chip/ plane (for example, a reciprocal of the number of BBs), the number of logical blocks usable in each bank/chip/plane, and the number of blocks belonging to the respective FB lists. Accordingly, in the bank, a chance of obtaining a free block FB from a chip and a plane with a fewer number of BBs increases, and the relaxation time can be leveled.

When the second algorithm is adopted, the following advantages can be further obtained. If the logical block is obtained one by one, the free block FB can be obtained from different banks each time in order of bank 0→bank 1→bank 2→bank 3→ . . . →bank N (N is a maximum value of the bank number), which is effective when important information is duplicated. As shown in FIG. 2, if the bank is different, a physical memory chip is different, and thus the signal line commonly connected to RyBy0 to RyBy3 becomes different. That is, even if one of the RyBy signal lines is broken and cannot operate, data can be read from a backup side. Therefore, when the important information is duplicated, reliability can be improved as compared to a case that the important information is physically duplicated in the same memory chip.

As the information required to be duplicated, for example, nonvolatile management information of the firmware operating on the SSD 100, such as the log and the snapshot can be considered. It is because if these pieces of information are lost, the data written in the NAND memory 10 cannot be read normally. When a memory chip for storing such management information required to be duplicated is to be selected, reliability improvement can be expected only by obtaining the free block FB for one logical block by adopting the second algorithm.

The following value can be adopted for a weighted value of the round robin. The NAND memory 10 generally includes a storage area (margin area) that cannot be seen from the host apparatus 1, other than a user data storage area (reserved area) that can be seen from the host 1. The reserves area can be specified by the LBA as a logical address used by the host 1. The margin area is used as a buffer area at the time of data transfer from the DRAM 20 to the reserved area or for storing the management information (including the logical-layer management tables 31 and the physical-layer management tables 32).

Because the reserved area has the same capacity as that of the SSD that can be seen from the user, the capacity of the reserved area needs to be maintained constant at all times even if the bad block BB is generated. Therefore, as the number of bad blocks BB increases, the margin area decreases as the entire SSD. When one logical block is focused and taken into consideration, it changes with a time corresponding to the use of the SSD to which of the reserved area and the margin area the logical block belongs. The logical block used as the reserved area is referred to as a reserved block and the logical block used as the margin area is referred to as a margin block.

For example, when a logical block used for storing the management information is released and returned to the free block list, and thereafter, is allocated as a logical block for storing user data, the logical block is one of the margin blocks at a point in time when being used for storing the management information; however, it becomes one of the reserved blocks at a point in time when being used for storing the user data. Furthermore, in a state in which the block is held in the free block list, it cannot be specified to which of the margin block and the reserved block one block corresponds, except of an exceptional situation.

If the number of margin blocks or the number of unused margin blocks is managed for each of the FB lists 50-1 to 50-L, a chance of obtaining a free block FB from a chip and a plane with a fewer number of BBs can be increased in the bank, by selecting a list (chip/plane) for obtaining the free block FB by using by a round-robin method weighted by the number of margin blocks or the number of unused margin blocks. The number of margin blocks is a sum total of the number of free blocks FB and the number of active blocks AB belonging to the margin area. The number of unused margin blocks is the number of free blocks FB belonging to the margin area.

The number of margin blocks and the number of unused margin blocks in one FB list are obtained in the following manner. That is, an entire memory capacity of the NAND memory 10 obtained by totalizing the margin area and the reserved area is divided by the total number of the FB lists, and a result of division is divided by the memory capacity of one logical block, to derive the number D of the logical blocks that can be entered in one FB list.

Figure 12:
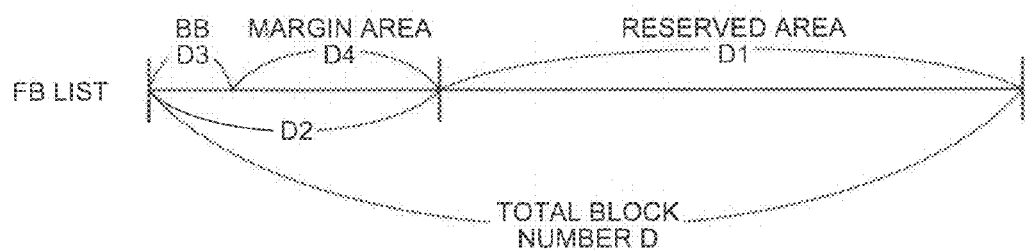
FIG. 12 is a conceptual diagram of a reserve area and a margin area.

FIG. 12 conceptually depicts allocation of margin/reserved blocks in one FB list. Because the reserved area needs to ensure a certain capacity at all times, the number D2 of the logical blocks obtained by subtracting a predetermined number D1 for the reserved block from the number D of the logical blocks that can be entered in one FB list becomes for the margin blocks if there is no bad block BB. If the number D3 of the bad blocks BB in the bank/chip/plane corresponding to the FB list is subtracted from the number D2 of the logical blocks, the number D4 of the margin blocks can be obtained. Furthermore, by sequentially subtracting the number of margin blocks being used as the management area or buffer area from the number D4 of the margin blocks, the number of unused margin blocks can be obtained.

Thus, a free block can be preferentially obtained from the bank/chip/plane with less number of bad blocks by selecting a list for obtaining the free block FB according to the round-robin method weighted by the number of margin blocks or the number of unused margin blocks for each FB list.

According to the present embodiment, a plurality of FB management lists is provided. In each FB management list, the logical blocks having the same bank number/chip number/plane number are managed, and the FB selecting unit 42 obtains a required logical block (free block FB) in response to a request from the logical layer managing unit 120*c*. Therefore, when large parallelism is required, high speed is realized by multi-parallel processing, and when small parallelism is sufficient, processing giving a priority to the writing efficiency can be performed.

Second Embodiment

Figure 13:
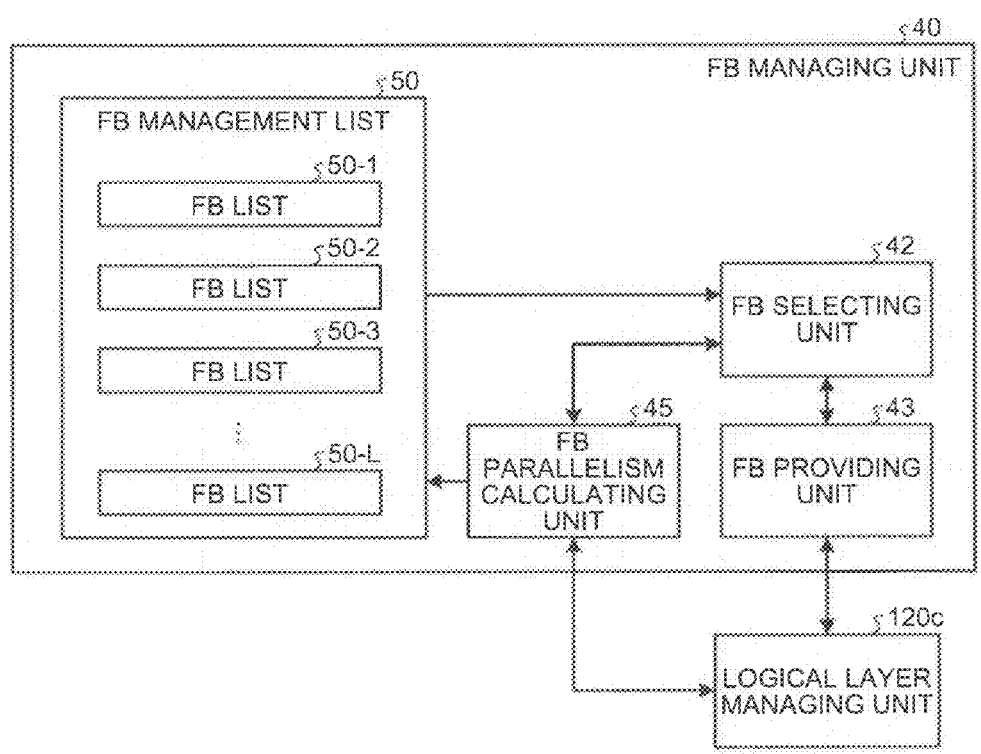
FIG. 13 is a diagram illustrating a configuration example of an FB managing unit according to a second embodiment of the present invention.

FIG. 13 depicts a second embodiment of the present invention, and an FB parallelism calculating unit 45 that calculates the number of free blocks FB that can operate in parallel is added in the FB managing unit 40 in FIG. 9.

Before requesting the free block FB to the FB providing unit 43, the logical layer managing unit 120*c* requests the FB parallelism calculating unit 45 to calculate the current number of free blocks FB capable of operating in parallel. The FB parallelism calculating unit 45 calculates the number of free blocks FB currently capable of operating in parallel in response to the request from the logical layer managing unit 120*c*. The number of free blocks FB capable of operating in parallel is calculated according to the following procedure.

(1) Calculate the parallelism in the bank.
(2) Add the parallelism calculated in the respective banks for all the banks.

The parallelism in the bank (how many free blocks FB can be simultaneously used in the bank) is determined by whether there is a pair of plane 0 and plane 1 having the same chip number in the free block FB in the bank (whether there is a pair of planes capable of operating in the double speed mode). When there is a pair of plane 0 and plane 1 having the same chip number in a certain bank, because the pair can perform the parallel operation in the double speed mode, the parallelism is 2. When there is only one of plane 0 and plane 1, the parallelism is 1, and when there is no free block FB in the bank, the parallelism is 0.

The FB parallelism calculating unit 45 notifies the logical layer managing unit 120c of the calculated number of free block FB capable of operating in parallel. The logical layer managing unit 120c can change the own processing according to a notified result (parallelism). For example, when the parallelism can be ensured efficiently, mass data is collected first to execute the write processing.

In the second embodiment, because possible parallelism is calculated and notified to the logical layer managing unit 120c, the logical layer managing unit 120c can perform efficient processing by changing the own processing according to the notified result, and the writing efficiency is improved.

Third Embodiment

In a third embodiment of the present invention, a specific processing content of the second embodiment is explained. In the third embodiment, when the physical layer managing unit 120d ensures parallelism n requested by the logical layer managing unit 120c, two modes of a double-speed priority mode for ensuring the parallelism by giving a priority to double speed and a bank priority mode for ensuring the parallelism by giving a priority to the bank parallelism can be switched.

Figures 14, 15:
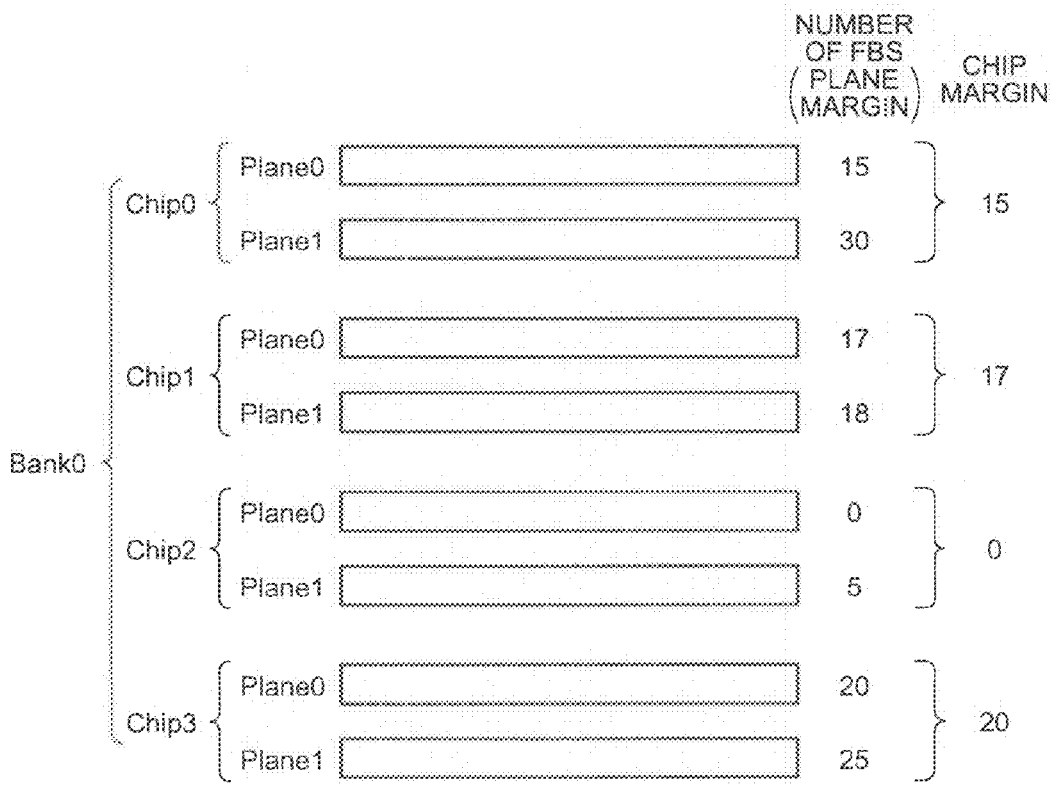
FIG. 14 a diagram illustrating a margin table.
FIG. 15 is an explanatory diagram of plane margins and chip margins.

The FB parallelism calculating unit 45 shown in FIG. 13 has a margin table shown in FIG. 14. As shown in FIG. 14, information relating to a margin of the chip when the double speed mode is used for each bank and information relating to a margin of the plane when a normal mode is used without using the double speed mode are registered in the margin table. The margin table is updated every time an event occurs in which registered data is to be updated.

The current number of free blocks FB in one of the FB lists 50-1 to 50-L formed as the list of the logical block having the same bank number/chip number/plane number, which are shown in FIG. 10, is defined as "plane margin". If the number of free blocks FB in one FB list 50-1 is for example 20, the plane margin held by the FB list is 20. When it is assumed that two "plane margins" constituting the chip are X and Y, the smaller "plane margin" is defined as "chip margin" of the chip. When the plane margin of plane 0 of one chip is 20 and the plane margin of plane 1 in the same chip is 15, the chip margin of the chip is 15.

In a column of double speed mode perspective in the margin table, information indicating which chip has the highest chip margin in the chips belonging to the bank (chip number) and a value of the chip margin (hereinafter, "bank margin at the time of a double speed operation") are held. In a column of normal mode perspective in the margin table, information indicating which plane of which chip has the highest margin in the planes belonging to the bank (chip number/plane number) and a value of the plane margin (hereinafter, "bank margin at the time of a normal operation") are held. A selection priority between the banks in the double-speed priority mode is determined based on the bank margin at the time of a double speed operation, and a selection priority between the banks in the bank priority mode is determined based on the bank margin at the time of a normal operation.

For example, when the plane margin and the chip margin in the respective chips and respective planes in bank 0 are in a state shown in FIG. 15, a chip having the highest chip margin in bank 0 is chip 3 having a chip margin of 20, and the plane having the highest plane margin in bank 0 is plane 1 of chip 0 having a plane margin of 30. Accordingly, in the column of the double speed mode perspective of bank 0 in the margin table, a chip number indicating chip 3 and a value 20 of the margin are registered, and in the column of the normal mode perspective, a chip number/plane number indicating chip 0/plane 1 and a value 30 of the margin are registered.

When the logical layer managing unit 120c as an upper layer requests the FB providing unit 43 to select a free block FB, the logical layer managing unit 120c first inquires the FB parallelism calculating unit 45 of the highest value of the currently selectable parallelisms and then requests the FB selecting unit 42 to allocate a block with the parallelism not exceeding the highest value via the FB providing unit 43. When being requested to allocate a free block FB from the logical layer managing unit 120c, the FB selecting unit 42 is in a state in which allocation with the specified parallelism can be performed at all times.

The parallelism calculation by the FB parallelism calculating unit 45 is performed according to the following procedure in the same manner as explained in the second embodiment.

(a) Calculate the parallelism of bank 0 in the following manner.

(a-1) When the margin at the time of a double speed operation is larger than 0, designate the parallelism of bank 0 as 2.

(a-2) When the margin at the time of a double speed operation is 0 and the margin at the time of a normal operation is larger than 0, designate the parallelism of bank 0 as 1.

(a-3) When the margins at the time of a double speed operation/normal speed are both 0, designate the parallelism of bank 0 as 0.

(b) Calculate the parallelisms of banks 1 to N in the same manner as bank 0.

(c) The sum total of the parallelisms of respective banks calculated in (a) and (b) are designated as the parallelism for selecting a block at that point in time, and informed to the logical layer managing unit 120c of the parallelism.

Figure 16:
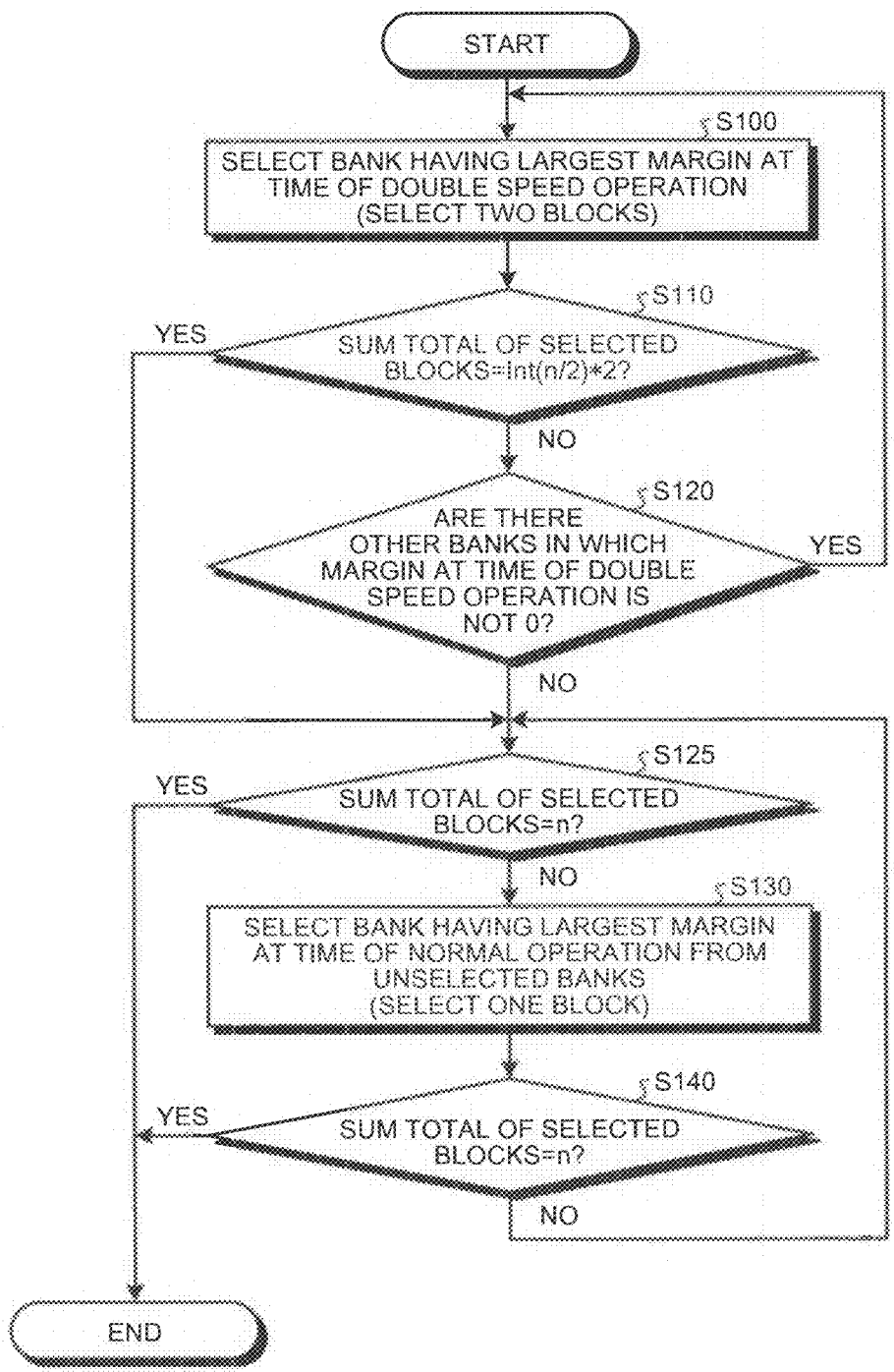
FIG. 16 is a flowchart of a control procedure of a double-speed priority mode according to a third embodiment of the present invention.

A double-speed priority system that ensures the parallelism by giving a priority to double speed is explained next with reference to FIG. 16. Execution of a double speed operation is limited with respect to a pair of free blocks FB in the same bank and chip but in a different plane. It is assumed here that allocation of a block with the parallelism n is requested from the logical layer managing unit 120c.

The FB selecting unit 42 in FIG. 12 refers to the margin table shown in FIG. 14 to select a bank having the largest margin at the time of a double speed operation, and selects one each, in total, two of the free blocks FB belonging to two planes of a chip corresponding to the margin of the selected bank at the time of a double speed operation (Step S100). The FB selecting unit 42 determines whether the sum total of the selected free blocks FB has reached Int(n/2)*2 (Step S110). Int(n/2)*2 represents an operation of truncating the numbers after the decimal point in a result of a division n/2 to obtain an integer value. For example, when n=3, Int(n/2)=1 and therefore Int(n/2)*2=2. When the result of the determination at Steps S110 is Yes, the procedure proceeds to Step S125. When the result of the determination at Steps S110 is No, the procedure proceeds to Step S120.

At Step S120, the FB selecting unit 42 refers to the margin table to determine whether there is a bank in which the margin at the time of a double speed operation is not 0 (Step S120). When there is a bank in which the margin at the time of a double speed operation is not 0, the FB selecting unit 42 selects a bank having the largest margin at the time of a double speed operation from the banks other than the bank already selected at Step S100, and selects one each of the free blocks FB belonging to two planes, in total two free blocks FB, of the chip corresponding to the margin of the selected bank at the time of a double speed operation (Step S100).

The procedure from Steps S100 to S120 is repeated until the sum total of the selected free blocks FB reaches Int(n/2)*2 or there is no bank in which the margin at the time of a double speed operation is not 0.

At Step S125, the FB selecting unit 42 determines whether the sum total of the selected free blocks FB reaches the parallelism n requested from the logical layer managing unit 120c. When the sum total of the selected free blocks FB reaches the parallelism n, the processing is finished.

When determination at Step S125 is No, the FB selecting unit 42 refers to the margin table to select a bank having the largest margin at the time of a normal operation from the unselected banks, and select one free block FB belonging to a chip/plane corresponding to the margin of the selected bank at the time of a normal operation (Step S130). Hereinafter, the processing at Steps S130 and S140 is repeated for the unselected banks until the sum total of the selected free blocks reaches the parallelism n. When the sum total of the selected free blocks reaches n, the selection processing is finished.

For example, it is assumed that the margin table is in a state shown in FIG. 17. In FIG. 17, in bank 0, chip 0 indicates the largest margin at the time of a double speed operation, the margin thereof is 15, and chip 0/plane 1 indicates the largest margin at the time of a normal operation and the margin thereof is 20. In bank 1, chip 2 indicates the largest margin at the time of a double speed operation, the margin thereof is 10, chip 2/plane 0 indicate the largest margin at the time of a normal operation and the margin thereof is 30. In bank 2, the largest margin at the time of a double speed operation is 0, and chip 3/plane 1 indicates the largest margin at the time of a normal operation and the margin thereof is 27. In bank 3, the largest margin at the time of a double speed operation is 0, chip 2/plane 0 indicates the largest margin at the time of a normal operation and the margin thereof is 9.

In the case of such a table state, it is assumed that the logical layer managing unit 120c requests the parallelism n=5 and a free block FB is selected by giving a priority to double speed. Bank 0 having the largest margin 15 at the time of a double speed operation is first selected, and one each, in total, two free blocks FB are selected from planes 0 and 1 of chip 0 of bank 0 (Step S100). In this state, because determinations at Steps S110 and S120 are No, bank 1 having the largest margin 10 at the time of a double speed operation is selected from banks 1 to 3 other than bank 0, and one each, in total, two free blocks FB are selected from planes 0 and 1 of chip 2 of bank 1 (Step S100). In this stage, the number of selected free blocks is four, and the determination at Step S110 is Yes and the determination at S125 is No, and the procedure proceeds to Step S130.

At Step S130, the FB selecting unit 42 selects bank 2 having the largest margin 27 at the time of a normal operation from unselected banks 2 and 3, and selects one free block FB from plane 1 of chip 3 of bank 2. Because the number of selected free blocks becomes five at this stage and determination at Step S140 is Yes, the selection processing is finished.

As a result, free blocks FB are selected one each from planes 0 and 1 of chip 0 of bank 0, planes 0 and 1 of chip 2 of bank 1, and plane 1 of chip 3 of bank 2, and parallelism 5 can be achieved by giving a priority to double speed.

Moreover, in the case of a table state shown in FIG. 17, when the logical layer managing unit 120c requests the parallelism n=3 and a free block FB is selected by giving a priority to double speed, bank 0 having the largest margin 15 at the time of a double speed operation is first selected, and one each, in total, two free blocks FB are selected from planes 0 and 1 of chip 0 of bank 0 (Step S100). In this stage, the number of selected free blocks is two, and the determination at Step S110 is Yes and the determination at S125 is No, and the procedure proceeds to Step S130. At Step S130, bank 1 having the largest margin 30 at the time of a normal operation is selected from unselected banks 2 and 3, and one free block FB is selected from plane 0 of chip 2 of bank 1. Because the number of selected free blocks becomes three at this stage and determination at Step S140 is Yes, the selection processing is finished.

As a result, free blocks FB are selected one each from planes 0 and 1 of chip 0 of bank 0 and plane 0 of chip 2 of bank 1, and parallelism 3 can be achieved by giving a priority to double speed.

Figure 18:
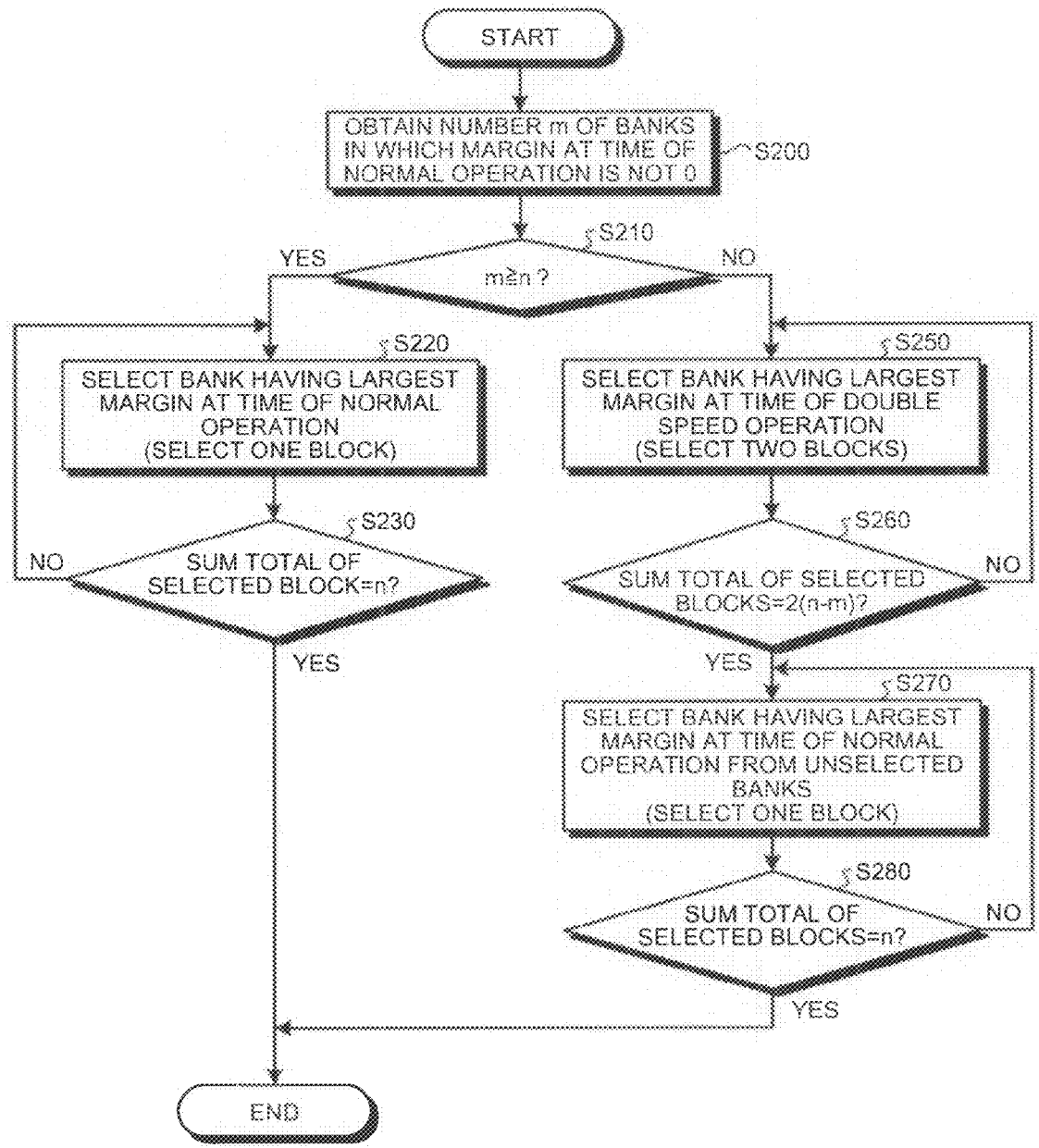
FIG. 18 is a flowchart of a control procedure of a bank priority mode according to the third embodiment.

A bank parallelism priority system that ensures the parallelism by giving a priority to the bank parallelism is explained next with reference to FIG. 18. It is assumed here that allocation of a block with the parallelism n is requested from the logical layer managing unit 120c.

The FB selecting unit 42 refers to the margin table to calculate the number m of banks in which the margin at the time of a normal operation is not 0 (Step S200). The FB selecting unit 42 compares the parallelism n specified by the logical layer managing unit 120c with m (Step S210). When m≧n, the FB selecting unit 42 executes processing at Steps S220 to S230, and when m<n, executes processing at Steps S250 to S280.

When m≧n, the FB selecting unit 42 refers to the margin table to select a bank having the largest margin at the time of a normal operation from all the banks, and selects one free block FB belonging to a chip/plane corresponding to the margin of the selected bank at the time of a normal operation (Step S220). The FB selecting unit 42 determines whether the sum total of the selected free blocks FB has reached the parallelism n requested from the logical layer managing unit 120c (Step S230). When the sum total has not reached the parallelism n, the FB selecting unit 42 repeats the processing at Steps S220 and S230 for the unselected banks until the sum total of the selected free blocks reaches the parallelism n. When the sum total of the selected free blocks reaches n, the FB selecting unit 42 finishes the selection processing.

When m<n, the FB selecting unit 42 refers to the margin table to select a bank having the largest margin at the time of a double speed operation from all the banks, and one each, in total, two of the free blocks FB belonging to two planes of a chip corresponding to the margin of the selected bank at the time of a double speed operation (Step S250). The FB selecting unit 42 determines whether the sum total of the selected free blocks FB has reached 2(n−m) (Step S260). When the sum total has not reached 2(n−m), the FB selecting unit 42 selects a bank having the largest margin at the time of a double speed operation from the unselected banks, and selects one each, in total, two of the free blocks FB belonging to two planes of a chip corresponding to the margin of the selected bank at the time of a double speed operation (Step S250). The processing at Steps S250 and S260 is repeated until the sum total of the selected free blocks FB reaches 2(n−m).

When the sum total of the selected free blocks FB has reached 2(n−m), the FB selecting unit 42 refers to the margin table to select a bank having the largest margin of the unselected banks at the time of a normal operation, and selects one free block FB belonging to a chip/plane corresponding to the margin of the selected bank at the time of a normal operation (Step S270). Hereinafter, the processing at Steps S270 and S280 is repeated for the unselected banks until the sum total of the selected free blocks reaches the parallelism n. When the sum total of the selected free blocks reaches n (Step S280), the selection processing is finished.

In the table state shown in FIG. 17, it is assumed that the parallelism n=3 is requested from the logical layer managing unit 120c to select a free block FB by giving a priority to bank parallelism. In the table state shown in FIG. 17, because the number of banks m=4, in which the margin at the time of a normal operation is not 0, m≧n is established at Step S210. Bank 1 having the largest margin at the time of a normal operation is selected first, and one free block FB is selected from plane 0 of chip 2 of bank 1 (Step S220). Bank 2 is then selected and one free block FB is selected from plane 1 of chip 3 of bank 2, and bank 0 is selected and one free block FB is selected from plane 1 of chip 0 of bank 0, thereby selecting three free blocks and achieve the parallelism n=3.

In the table state shown in FIG. 17, it is assumed that the parallelism n=5 is requested from the logical layer managing unit 120c to select a free block FB by giving a priority to bank parallelism. Because the number of banks m=4, m<n is established at Step S210. At Step S250, bank 0 having the largest margin at the time of a double speed operation is selected, and one each, in total, two free blocks FB are selected from planes 0 and 1 of chip 0 of bank 0. At this stage of selection, determination at Step S260 becomes Yes, and a free block FB is selected one each from the unselected banks 1 to 3 by repeating the processing at Steps S270 and S280 three times (plane 0 of chip 2 of bank 1, plane 1 of chip 3 of bank 2, and plane 0 of chip 2 of bank 3). Accordingly, in total, five free blocks FB are selected, thereby enabling to achieve the parallelism n=5.

In the case of giving a priority to bank parallelism, the processing at Steps S250 and S260 is performed to use the double speed mode for a portion which is not provided by bank parallelism. That is, in a case that parallelism 5 is requested in a configuration of 4 banks and 2 planes, when the priority is given to the bank parallelism, the double-speed mode is used only for one bank and the normal mode is used for the remaining three banks. In a case that parallelism 5 is requested in a configuration of 4 banks and 2 planes, when the priority is given to the double speed, the double speed mode is used in two banks as much as possible, and the normal mode is used in the remaining one bank.

Thus, in the third embodiment, when the requested the parallelism n is ensured by using the margin table in which the bank margin at the time of a normal operation and the bank margin at the time of a double speed operation are registered, two modes, that is, the double-speed priority mode for ensuring the parallelism by giving a priority to double speed and the bank priority mode for ensuring the parallelism by giving a priority to the bank parallelism can be switched. When the double speed mode is used, possibility of ensuring the larger parallelism increases than in the normal mode. Accordingly, when the requested parallelism is small, the bank parallelism priority system by giving a priority to the normal mode is used, and when the requested parallelism is large, the double-speed priority system is used. Then, when the bank is operated with small parallelism, many sets of logical blocks capable of performing the double speed operation can be maintained. When the bank is actually operated with a large parallelism, possibility of continuously performing the double speed operation many times increases, and the write processing of large data can be performed at high speed.

In the third embodiment, the current number of free blocks FB is registered as the margin in the margin table, to select a FB list in the double-speed priority mode or the bank priority mode based on the margin. However, the value inversely corresponding to the number of bad blocks BB (for example, a reciprocal of the number of BBs) explained in the first embodiment, the number of logical blocks usable in each bank/chip/plane, or the number of margin blocks or unused margin blocks can be designated as the margin to select a FB list in the double-speed priority mode or the bank priority mode according to the margin.

Fourth Embodiment

FIG. 19 is a perspective view of an example of a PC 1200 on which the SSD 100 is mounted. The PC 1200 includes a main body 1201 and a display unit 1202. The display unit 1202 includes a display housing 1203 and a display device 1204 accommodated in the display housing 1203.

The main body 1201 includes a chassis 1205, a keyboard 1206, and a touch pad 1207 as a pointing device. The chassis 1205 includes a main circuit board, an optical disk device (ODD) unit, a card slot, and the SSD 100.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 100 can be used instead of a conventional hard disk drive (HDD) in the state of being mounted on the PC 1200 or can be used as an additional device in the state of being inserted into the card slot.

FIG. 20 is a schematic diagram of a system configuration example of the PC 1200 on which the SSD 100 is mounted. The PC 1200 includes a CPU 1301, a north bridge 1302, a main memory 1303, a video controller 1304, an audio controller 1305, a south bridge 1309, a basic input/output system read-only memory (BIOS-ROM) 1310, the SSD 100, an ODD unit 1311, an embedded controller/keyboard controller IC (EC/KBC) 1312, and a network controller 1313.

The CPU 1301 is a processor for controlling an operation of the PC 1200, and executes an operating system (OS) loaded from the SSD 100 onto the main memory 1303. Furthermore, when the ODD unit 1311 is capable of executing at least one of read processing and write processing on a mounted optical disk, the CPU 1301 executes the processing.

Moreover, the CPU 1301 executes a system BIOS stored in the BIOS-ROM 1310. The system BIOS is a computer program for controlling a hardware of the PC 1200.

The north bridge 1302 is a bridge device that connects a local bus of the CPU 1301 to the south bridge 1309. The north bridge 1302 has a memory controller for controlling an access to the main memory 1303.

Moreover, the north bridge 1302 has a function of executing a communication with the video controller 1304 and a communication with the audio controller 1305 through an accelerated graphics port (AGP) bus and the like.

The main memory 1303 temporarily stores therein a computer program and data, and functions as a work area of the CPU 1301. The main memory 1303, for example, consists of a DRAM.

The video controller 1304 is a video reproduction controller for controlling the display unit 1202 used as a display monitor of the PC 1200.

The audio controller 1305 is an audio reproduction controller for controlling a speaker 1306 of the PC 1200.

The south bridge 1309 controls each device on a low pin count (LPC) bus 1314 and each device on a peripheral component interconnect (PCI) bus 1315. Moreover, the south bridge 1309 controls the SSD 100 that is a memory device storing various types of software and data through the ATA interface.

The PC 1200 accesses the SSD 100 in sector units. A write command, a read command, a cache flush command, and the like are input to the SSD 100 through the ATA interface.

The south bridge 1309 has a function of controlling an access to the BIOS-ROM 1310 and the ODD unit 1311.

The EC/KBC 1312 is a one-chip microcomputer in which an embedded controller for power management and a keyboard controller for controlling the keyboard 1206 and the touch pad 1207 are integrated.

The EC/KBC 1312 has a function of turning on/off the PC 1200 based on an operation of a power button by a user. The network controller 1313 is, for example, a communication device that executes communication with an external network such as the Internet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile semiconductor memory having a plurality of channel parallel operation elements including a plurality of memory chips, in which each memory chip is divided into a plurality of planes capable of operating in parallel, each plane includes a plurality of physical blocks as a unit of data erasing, and the memory chips in the respective channel parallel operation elements operated in parallel are divided into a plurality of banks, which respectively shares a ready/busy signal, over the channel parallel operation elements; and
a controller that manages a free block based on a logical block associated with physical blocks selected from the channel parallel operation elements operated in parallel and controls a parallel operation by the planes, banks, or channel parallel operation elements,
wherein the controller includes:
a plurality of free-block management lists in which logical blocks with a same bank number, a same chip number, and a same plane number are respectively managed as free blocks; and
a free block selecting unit that selects a required number of free-block management lists from the free-block management lists to obtain a free block from selected free-block management lists.

2. The memory system according to claim 1,
wherein the free block selecting unit selects the required number of free-block management lists from the free-block management lists so that a free-block management list corresponding to one plane having less number of bad blocks belonging to one bank and belonging to one chip is preferentially selected.

3. The memory system according to claim 1,
wherein the free block selecting unit selects the required number of free-block management lists from the free-block management lists without setting priorities between the banks, and selects the required number of free-block management lists from the free-block management lists in a bank so that a free-block management list corresponding to one plane having less number of bad blocks belonging to one bank and belonging to one chip is preferentially selected.

4. The memory system according to claim 3,
wherein the free block selecting unit selects the required number of free-block management lists from the free-block management lists by using round robin weighted by a value inversely corresponding to the number of bad blocks of said one plane.

5. The memory system according to claim 3,
wherein the free block selecting unit selects the required number of free-block management lists from the free-block management lists by using round robin weighted by number of logical blocks entered into a free-block management list.

6. The memory system according to claim 3,
wherein the free block selecting unit selects the required number of free-block management lists from the free-block management lists by using round robin weighted by number of logical blocks usable as a free block and an active block.

7. The memory system according to claim 3,
wherein the free block selecting unit selects the required number of free-block management lists from the free-block management lists by using round robin weighted by number of logical blocks belonging to a margin area excluding a reserved area which can be specified by a logical address to be used on a host side, of a storage area of the nonvolatile semiconductor memory, and usable as a free block and an active block.

8. The memory system according to claim 3,
wherein the free block selecting unit selects the required number of free-block management lists from the free-block management lists by using round robin weighted by number of free blocks, of logical blocks belonging to a margin area excluding a reserved area which can be specified by a logical address to be used on a host side, of a storage area of the nonvolatile semiconductor memory, and usable as a free block and an active block.

9. The memory system according to claim 1, further comprising a free-block parallelism calculating unit that calculates number of free blocks capable of operating in parallel.

10. The memory system according to claim 9,
wherein when a parallelism, which is number of free blocks operating in parallel, is specified, the free block selecting unit can switch between a first mode in which a parallel operation of respective planes is given priority, and a second mode in which a parallel operation of banks is given priority, and selects the required number of free-block management lists corresponding to a selected mode from the free-block management lists.

11. The memory system according to claim 10,
wherein the free block selecting unit includes a table in which a first piece of information indicating a selection priority between banks in a first mode and a second piece of information indicating a selection priority between banks in a second mode are registered for each bank, and the free block selecting unit selects the required number of free-block management lists corresponding to the selected mode from the free-block management lists according to the information registered in the table.

12. The memory system according to claim 11,
wherein a plane margin is set as number of free blocks in each plane in each chip belonging to a bank, and a chip margin is set as a minimum value of the plane margins of a plurality of planes included in a same chip, the first piece of information includes information for identifying a chip having a largest chip margin of the chips belonging to a bank and a largest value of the chip margin, and the second piece of information includes information for identifying a plane in a chip having a largest plane margin of the planes in each chip belonging to a bank and the largest value of the plane margin.

13. The memory system according to claim 12,
wherein when the first mode is to be executed, the free block selecting unit preferentially selects the plane in the chip included in the second piece of information registered in the table than the chip included in the first piece of information, and preferentially selects a plane in a chip or a chip having a larger plane margin or chip margin, and when the second mode is to be executed, the free block selecting unit preferentially selects the chip included in the first piece of information registered in the table than the plane in the chip included in the second piece of information, and preferentially selects a plane in a chip or a chip having a larger plane margin or chip margin.

14. A method of controlling a memory system for controlling a nonvolatile semiconductor memory having a plurality of channel parallel operation elements including a plurality of memory chips, in which each memory chip is divided into a plurality of planes capable of operating in parallel, each plane includes a plurality of physical blocks as a unit of data erasing, and the memory chips in the respective channel parallel operation elements operated in parallel are divided into a plurality of banks, which respectively shares a ready/busy signal, over the channel parallel operation elements so that a parallel operation by the planes, banks, or channel parallel operation elements can be performed, the method comprising:

respectively managing a free block as a logical block associated with a plurality of physical blocks selected from the channel parallel operation elements operated in parallel, as a free block with a same bank number, a same chip number, and a same plane number in a plurality of free-block management lists; and selecting a required number of free-block management lists from the free-block management lists to obtain a free block from selected free-block management lists.

15. The method according to claim 14, comprising selecting the required number of free-block management lists from the free-block management lists so that a free-block management list corresponding to one plane having less number of bad blocks belonging to one bank and belonging to one chip is preferentially selected, when obtaining the free block.

16. The method according to claim 14, comprising selecting the required number of free-block management lists from the free-block management lists without setting priorities between the banks, and selects the required number of free-block management lists from the free-block management lists in a bank so that a free-block management list corresponding to one plane having less number of bad blocks belonging to one bank and belonging to one chip is preferentially selected, when obtaining the free block.

17. The method according to claim 16, comprising selecting the required number of free-block management lists from the free-block management lists by using round robin weighted by a value inversely corresponding to the number of bad blocks of said one plane, when obtaining the free block.

18. The method according to claim 16, comprising selecting the required number of free-block management lists from the free-block management lists by using round robin weighted by number of logical blocks entered into a free-block management list, when obtaining the free block.

19. The method according to claim 16, comprising selecting the required number of free-block management lists from the free-block management lists by using round robin weighted by number of logical blocks usable as a free block and an active block, when obtaining a free block.

20. The method according to claim 16, comprising selecting the required number of free-block management lists from the free-block management lists by using round robin weighted by number of logical blocks belonging to a margin area excluding a reserved area which can be specified by a logical address to be used on a host side, of a storage area of the nonvolatile semiconductor memory, and usable as a free block and an active block, when obtaining a free block.

21. The method according to claim 16, comprising selecting the required number of free-block management lists from the free-block management lists by using round robin weighted by number of free blocks, of logical blocks belonging to a margin area excluding a reserved area which can be specified by a logical address to be used on a host side, of a storage area of the nonvolatile semiconductor memory, and usable as a free block and an active block, when obtaining a free block.

22. The method according to claim 14, further comprising calculating number of free blocks capable of operating in parallel.

23. The method according to claim 22, comprising:
when obtaining the free block, in a case where a parallelism, which is number of free blocks operating in parallel, is specified, enabling switching between a first mode in which a parallel operation of respective planes is given priority, and a second mode in which a parallel operation of banks is given priority; and selecting the required number of free-block management lists corresponding to a selected mode from the free-block management lists.

24. The method according to claim 23, comprising selecting the required number of free-block management lists corresponding to the selected mode from the free-block management lists according to information registered in a table in which a first piece of information indicating a selection priority between banks in a first mode and a second piece of information indicating a selection priority between banks in a second mode are registered for each bank, when obtaining the free block.

25. The method according to claim 24,
wherein a plane margin is set as number of free blocks in each plane in each chip belonging to a bank, and a chip margin is set as a minimum value of the plane margins of a plurality of planes included in a same chip, the first piece of information includes information for identifying a chip having a largest chip margin of the chips belonging to a bank and a largest value of the chip margin, and the second piece of information includes information for identifying a plane in a chip having a largest plane margin of the planes in each chip belonging to a bank and the largest value of the plane margin.

26. The method according to claim 25, comprising, when obtaining the free block:

preferentially selecting the plane in the chip included in the second piece of information registered in the table than the chip included in the first piece of information, and preferentially selecting a plane in a chip or a chip having a larger plane margin or chip margin, when the first mode is to be executed; and preferentially selecting the chip included in the first piece of information registered in the table than the plane in the chip included in the second piece of information, and preferentially selecting a plane in a chip or a chip having a larger plane margin or chip margin, when the second mode is to be executed.

27. A controller that controls a nonvolatile semiconductor memory having a plurality of channel parallel operation elements including a plurality of memory chips, in which each memory chip is divided into a plurality of planes capable of operating in parallel, each plane includes a plurality of physical blocks as a unit of data erasing, and the memory chips in the respective channel parallel operation elements operated in parallel are divided into a plurality of banks, which respectively shares a ready/busy signal, over the channel parallel operation elements so that a parallel operation by the planes, banks, or channel parallel operation elements can be performed, the controller comprising:

a plurality of free-block management lists for respectively managing a free block as a logical block associated with a plurality of physical blocks selected from the channel parallel operation elements operated in parallel, as a free block with a same bank number, a same chip number, and a same plane number; and a free block selecting unit that selects a required number of free-block management lists from the free-block management lists to obtain a free block from selected free-block management lists.

28. The controller according to claim 27, wherein the free block selecting unit selects the required number of free-block management lists from the free-block management lists without setting priorities between the banks, and selects the required number of free-block management lists from the free-block management lists in a bank so that a free-block management list corresponding to one plane having less number of bad blocks belonging to one bank and belonging to one chip is preferentially selected.

* * * * *